(12) United States Patent
Zhang et al.

(10) Patent No.: US 12,014,664 B2
(45) Date of Patent: Jun. 18, 2024

(54) SHIFT REGISTER, DISPLAY PANEL, AND DISPLAY APPARATUS

(71) Applicants: Wuhan Tianma Microelectronics Co., Ltd., Wuhan (CN); Wuhan Tianma Microelectronics Co., Ltd. Shanghai Branch, Shanghai (CN)

(72) Inventors: Mengmeng Zhang, Wuhan (CN); Yue Li, Wuhan (CN)

(73) Assignees: Wuhan Tianma Microelectronics Co., Ltd., Wuhan (CN); Wuhan Tianma Microelectronics Co., Ltd., Shanghai Branch, Shanghai (CN)

( * ) Notice: Subject to any disclaimer, the term of this patent is extended or adjusted under 35 U.S.C. 154(b) by 0 days.

(21) Appl. No.: 18/205,150

(22) Filed: Jun. 2, 2023

(65) Prior Publication Data

US 2023/0326383 A1 Oct. 12, 2023

(30) Foreign Application Priority Data

Jan. 19, 2023 (CN) .......................... 202310095918.8

(51) Int. Cl.
 *G09G 3/3266* (2016.01)
 *G09G 3/20* (2006.01)
 *G11C 19/28* (2006.01)

(52) U.S. Cl.
 CPC .............. *G09G 3/20* (2013.01); *G11C 19/28* (2013.01); *G09G 2300/0819* (2013.01); *G09G 2300/0842* (2013.01); *G09G 2300/0861* (2013.01); *G09G 2310/0286* (2013.01); *G09G 2330/021* (2013.01)

(58) Field of Classification Search
 CPC ............ G09G 3/20; G09G 2300/0819; G09G 2300/0842; G09G 2300/0861; G09G 2310/0286; G09G 2330/021; G09G 3/3233; G09G 3/3266; G11C 19/28
 See application file for complete search history.

(56) References Cited

U.S. PATENT DOCUMENTS

2020/0388229 A1* 12/2020 Zhang .................. G09G 3/3266
2021/0118389 A1* 4/2021 Zhang .................. G09G 3/3266
2022/0335901 A1* 10/2022 Zhang .................. G09G 3/3233

FOREIGN PATENT DOCUMENTS

CN          112259038 A          1/2021
CN          112951163 A          6/2021

* cited by examiner

*Primary Examiner* — Abdul-Samad A Adediran
(74) *Attorney, Agent, or Firm* — KDW Firm PLLC

(57) ABSTRACT

A shift register includes a plurality of cascaded shift register circuits. The first control module of a shift register circuit controls the potential of a first node according to a first clock signal, a second clock signal, and the potential of the first node. A second control module controls the potential of a second node according to the first level signal of a third clock signal and the potential of the first node. An output module controls, according to the potential of the first node, the time of outputting the first level signal and controls, according to the potential of the second node, the time of outputting a second level signal. In a data writing phase, the third clock signal includes a plurality of effective pulses. In at least in a first retention frame, the third clock signal is an ineffective fixed level.

20 Claims, 13 Drawing Sheets

SHIFT REGISTER, DISPLAY PANEL, AND DISPLAY APPARATUS

CROSS-REFERENCE TO RELATED APPLICATION

This application claims priority to Chinese Patent Application No. CN202310095918.8, filed on Jan. 19, 2023, the disclosure of which is incorporated herein by reference in its entirety.

TECHNICAL FIELD

Embodiments of the present disclosure relate to the field of display technologies and, in particular, to a shift register, a display panel, and a display apparatus.

BACKGROUND

With the development of display technologies, the power consumption of a display apparatus increases when a higher resolution of the display apparatus is demanded. To reduce the power consumption of the display apparatus, some products even work at a drive frequency of 0.1 Hz or less in a standby mode.

In the related art, when a display panel is in a low-frequency retention phase, a shift register circuit is still in a normal working state. As a result, the power consumption generated by the shift register circuit is the same as that in a high-frequency display mode, resulting in the display panel still having relatively large power consumption. Thus, the advantage of low power consumption in a low-frequency display mode is not fully exerted.

SUMMARY

The present disclosure provides a shift register, a display panel, and a display apparatus to reduce power consumption of the display apparatus in a low-frequency display mode.

In a first aspect, an embodiment of the present disclosure provides a shift register. The shift register includes a plurality of cascaded shift register circuits. A shift register circuit includes a first clock terminal, a second clock terminal, a third clock terminal, a first level terminal, a second level terminal, a signal input terminal, a signal output terminal, a first control module, a second control module, and an output module.

In the same shift register circuit, the first control module and the output module are electrically connected to a first node. The first control module is also electrically connected to the first clock terminal, the second clock terminal, and the signal input terminal. The first control module is configured to control potential of the first node according to the first clock signal of the first clock terminal, the second clock signal of the second clock terminal, and the input signal of the signal input terminal. The second control module and the output module are electrically connected to a second node. The second control module is also electrically connected to the third clock terminal, the first level terminal, and the first node. The second control module is configured to control potential of the second node according to the third clock signal of the third clock terminal, the first level signal of the first level terminal, and the potential of the first node. The output module is also electrically connected to the first level terminal, the second level terminal, and the signal output terminal, separately. The output module is configured to control, under control of the potential of the first node, a time point at which the signal output terminal outputs the first level signal and control, under control of the potential of the second node, a time point at which the signal output terminal outputs the second level signal of the second level terminal.

Each drive cycle of the shift register includes a data writing phase and a retention phase. The retention phase includes at least one first retention frame. In the data writing phase, the third clock signal includes a plurality of effective pulses. Second level signals outputted from signal output terminals of the plurality of shift register circuits are sequentially shifted. In the retention phase, the plurality of shift register circuits each output the first level signal. At least in the at least one first retention frame, the third clock signal is an ineffective fixed level.

In a second aspect, an embodiment of the present disclosure also provides a display panel. The display panel includes the shift register described in the first aspect.

In a third aspect, an embodiment of the present disclosure also provides a display apparatus. The apparatus includes the display panel described in the second aspect.

According to the technical solutions in the present disclosure, each drive cycle of the shift register includes the data writing phase and the retention phase. In the data writing phase, the second level signals outputted from the shift register circuits in the shift register are sequentially shifted. In the retention phase, the shift register circuits each remain outputting the first level signal. Moreover, the potential of the first node can control the output time of the first level signal, and the potential of the second node controls the output time of the second level signal. Therefore, in the data writing phase, the third clock signal includes a plurality of effective pulses so that the second control modules of the shift register circuits accurately charge and discharge the second node and nodes associated with the second node according to the third clock signal, the first level signal, and the potential of the first node to control the potential of the second node and ensure that the shift register circuits can accurately output the second level signals. In the retention stage, the shift register circuits do not output the second level signals, at this time, at least in the first retention frame of the retention phase, the third clock signal is set to an ineffective fixed level, and thus, the third clock signal does not repeatedly charge and discharge the nodes in the second control module to avoid power consumption waste caused by repeated charging and discharging, thereby facilitating the reduction of power consumption of the shift register. When the shift register is applied to the display panel, the power consumption of the display panel in a low-frequency display mode can be significantly reduced.

It is to be understood that the contents described in this part are not intended to identify key or important features of the embodiments of the present disclosure, and are not intended to limit the scope of the present disclosure. Other features of the present disclosure are readily understood through the description hereinafter.

BRIEF DESCRIPTION OF DRAWINGS

To illustrate the technical solutions in the embodiments of the present disclosure or the technical solutions in the related art more clearly, drawings used in the description of the embodiments or the related art are briefly described below. Apparently, although the drawings described below illustrate part of specific embodiments of the present disclosure, those skilled in the art may expand and extend to other structures and drawings according to the basic concepts of the device structure, driving method, and manufacturing

DETAILED DESCRIPTION

Figure 1:
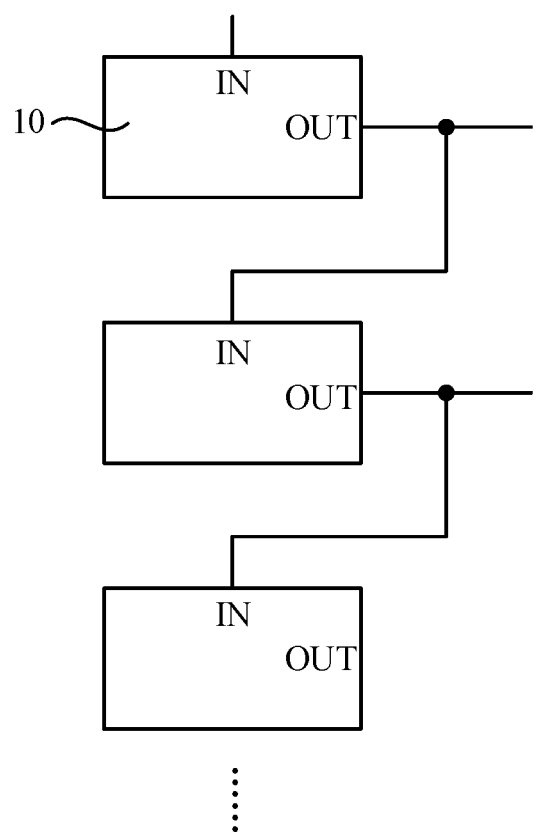
FIG. 1 is a diagram illustrating the structure of a shift register according to an embodiment of the present disclosure.

In order that the objects, technical solutions, and advantages of the present disclosure are clearer, the technical solutions of the present disclosure are described more clearly and completely hereinafter with reference to drawings of embodiments of the present disclosure and in conjunction with implementations. Apparently, the embodiments described herein are some embodiments, not all embodiments, of the present disclosure. All other embodiments obtained by those skilled in the art based on the basic concepts disclosed and indicated in embodiments of the present disclosure are within the scope of the present disclosure.

As described in the background, because shift register circuits are provided with active devices or passive devices such as transistors and capacitors, in the working process of the shift register circuits, a clock signal provided to the shift register circuits repeatedly charges and discharges devices in the shift register circuits. In particular, during a low-frequency retention phase of a display panel and the long period when signal output terminals of the shift register circuits output a fixed level, the clock signal continuously charges and discharges the devices in the shift register circuits repeatedly. This causes waste of power consumption and is not conducive to the low power consumption of the shift register including the shift register circuits.

Based on the preceding technical problems, an embodiment of the present disclosure provides a shift register. The shift register includes multiple cascaded shift register circuits. A shift register circuit includes a first clock terminal, a second clock terminal, a third clock terminal, a first level terminal, a second level terminal, a signal input terminal, a signal output terminal, a first control module, a second control module, and an output module.

In the same shift register circuit, the first control module and the output module are electrically connected to a first node. The first control module is also electrically connected to the first clock terminal, the second clock terminal, and the signal input terminal. The first control module is configured to control potential of the first node according to the first clock signal of the first clock terminal, the second clock signal of the second clock terminal, and the input signal of the signal input terminal. The second control module and the output module are electrically connected to a second node. The second control module is also electrically connected to the third clock terminal, the first level terminal, and the first node. The second control module is configured to control potential of the second node according to the third clock signal of the third clock terminal, the first level signal of the first level terminal, and the potential of the first node. The output module is also electrically connected to the first level terminal, the second level terminal, and the signal output terminal, separately. The output module is configured to control, under control of the potential of the first node, a time point at which the signal output terminal outputs the first level signal and control, under control of the potential of the second node, a time point at which the signal output terminal outputs the second level signal of the second level terminal.

Each drive cycle of the shift register includes a data writing phase and a retention phase. The retention phase includes at least one first retention frame. In the data writing phase, the third clock signal includes multiple effective pulses. Second level signals outputted from signal output terminals of the shift register circuits are sequentially shifted. In the retention phase, the shift register circuits each output the first level signal. At least in the first retention frame, the third clock signal is an ineffective fixed level.

According to the preceding technical solutions, each drive cycle of the shift register includes the data writing phase and the retention phase. In the data writing phase, the second level signals outputted from the shift register circuits in the shift register are sequentially shifted. In the retention phase, the shift register circuits each remain outputting the first level signal. Moreover, the potential of the first node can control the output time of the first level signal, and the potential of the second node controls the output time of the second level signal. Therefore, in the data writing phase, the third clock signal includes multiple effective pulses so that the second control modules of the shift register circuits accurately charge and discharge the second node and nodes associated with the second node according to the third clock signal, the first level signal, and the potential of the first node to control the potential of the second node and ensure that the shift register circuits can accurately output the second level signals. In the retention phase, the shift register circuits do not output the second level signals, at this time, at least in the first retention frame of the retention phase, the third clock signal is set to an ineffective fixed level, and thus, the third clock signal does not repeatedly charge and discharge the nodes in the second control module to avoid power consumption waste caused by repeated charging and discharging, thereby facilitating the reduction of power consumption of the shift register. When the shift register is applied to the display panel, the power consumption of the display panel in a low-frequency display mode can be significantly reduced.

The preceding is the core idea of the present application. Technical solutions in embodiments of the present disclosure are described clearly and completely below in conjunction with the drawings in embodiments of the present disclosure. Apparently, the embodiments described below are part, not all, of embodiments of the present disclosure. Based on the embodiments of the present disclosure, all other embodiments obtained by those of ordinary skill in the art without creative work are within the protection scope of the present disclosure.

Figure 2:
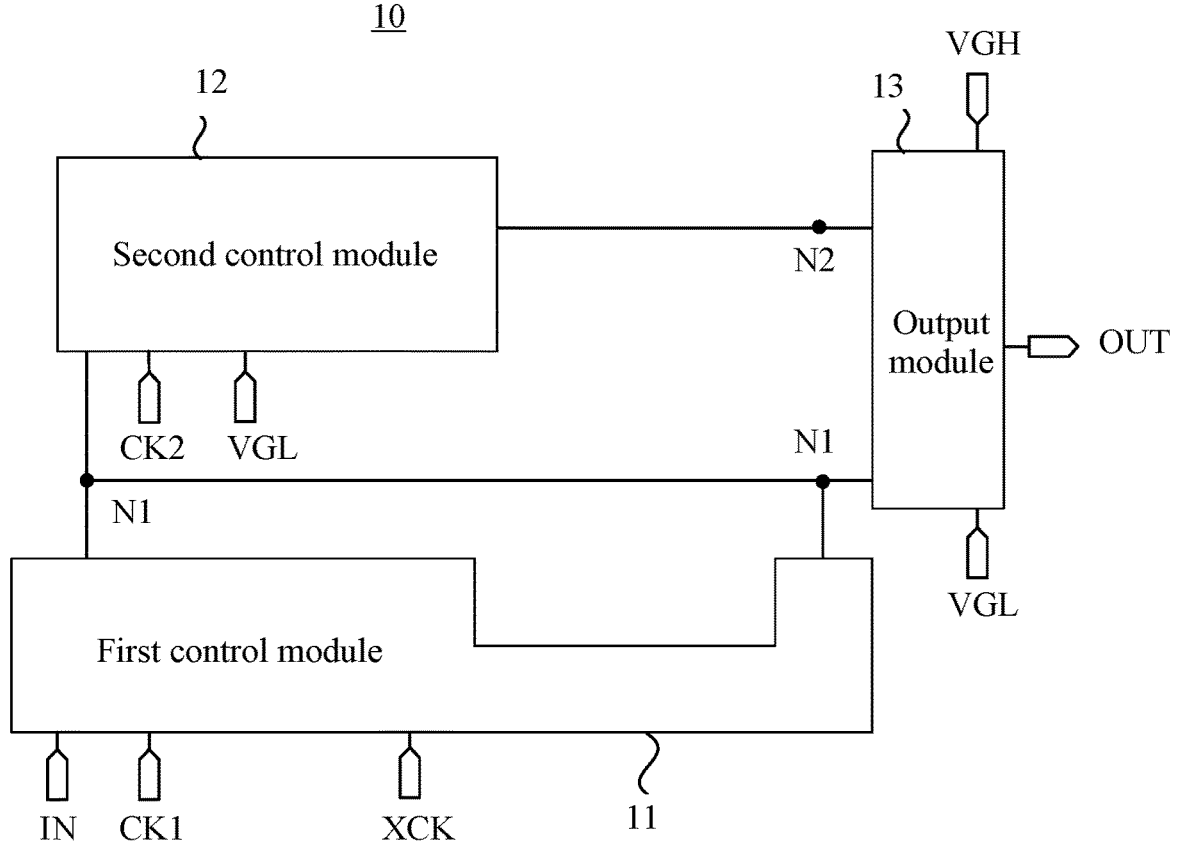
FIG. 2 is a diagram illustrating the structure of a shift register circuit according to an embodiment of the present disclosure.

FIG. 1 is a diagram illustrating the structure of a shift register according to an embodiment of the present disclosure. FIG. 2 is a diagram illustrating the structure of a shift register circuit according to an embodiment of the present disclosure. With reference to FIG. 1 and FIG. 2, a shift register 100 includes multiple cascaded shift register circuits 10. A shift register circuit 10 includes a first clock terminal CK1, a second clock terminal XCK, a third clock terminal CK2, a first level terminal VGL, a second level terminal VGH, a signal input terminal IN, a signal output terminal OUT, a first control module 11, a second control module 12, and an output module 13.

In the same shift register circuit 10, the first control module 11 and the output module 13 are electrically connected to a first node N1. The first control module 11 is also electrically connected to the first clock terminal CK1, the second clock terminal XCK, and the signal input terminal IN. The first control module 11 is configured to control potential of the first node N1 according to the first clock signal ck1 of the first clock terminal CK1, the second clock signal xck of the second clock terminal XCK, and the input signal Vin of the signal input terminal IN. The second control module 12 and the output module 13 are electrically connected to a second node N2. The second control module 12 is also electrically connected to the third clock terminal CK2, the first level terminal VGL, and the first node N1. The second control module 12 is configured to control potential of the second node N2 according to the third clock signal ck2 of the third clock terminal CK2, the first level signal Vg1 of the first level terminal VGL, and the potential of the first node N1. The output module 13 is also electrically connected to the first level terminal VGL, the second level terminal VGH, and the signal output terminal OUT, separately. The output module 13 is configured to control, under control of the potential of the first node N1, the time point at which the signal output terminal OUT outputs the first level signal Vg1 and control, under control of the potential of the second node N2, the time point at which the signal output terminal OUT outputs the second level signal Vgh of the second level terminal VGH.

It is to be understood that the electrical connection mentioned in this embodiment may be direct connection. For example, regarding that the first control module 11 is electrically connected to the first clock terminal CK1, the first control module 11 may be electrically connected to the first clock terminal directly. Alternatively, the electrical connection may also be connection through other elements. For example, regarding that the first control module 11 is electrically connected to the first clock terminal CK1, the first control module 11 may be electrically connected to the first clock terminal CK1 by a device such as a resistor, a capacitor, an inductor, or a switch. On the premise that the core disclosure points of this embodiment of the present disclosure can be implemented, the definition of electrical connection is not specifically limited in this embodiment of the present disclosure.

Each drive cycle of the shift register 100 includes a data writing phase t1 and a retention phase t2. The retention phase t2 includes at least one first retention frame t21. In the data writing phase t1, the third clock signal ck2 includes multiple effective pulses. Second level signals Vgh outputted from signal output terminals OUT of the shift register circuits 10 at different stages are sequentially shifted. In the retention phase t2, the shift register circuits 10 at different stages each output the first level signal Vg1. At least in the first retention frame t21, the third clock signal ck2 is an ineffective fixed level.

It is to be understood that with reference to FIG. 1, the shift register 100 includes multiple cascaded shift register circuits 10. The signal input terminal IN of a shift register circuit 10 at a first stage receives a start pulse signal. Thus, the start pulse signal can control a signal outputted from the shift register circuit 10 at the first stage. The signal input terminal IN of a shift register circuit 10 at each stage except the shift register circuit 10 at the first stage is electrically connected to the signal output terminal OUT of a shift register circuit 10 at the previous stage. Thus, the signal outputted from the signal output terminal OUT of a shift register circuit 10 at the previous stage can control the signal outputted from the signal output terminal OUT of a shift register circuit 10 at the next stage. With reference to FIG. 2, an enable signal outputted from the signal output terminal OUT of a shift register circuit 10 at each stage may be the first level signal Vg1 of the first level terminal VGL or the second level signal Vgh of the second level terminal VGH.

Figure 3:
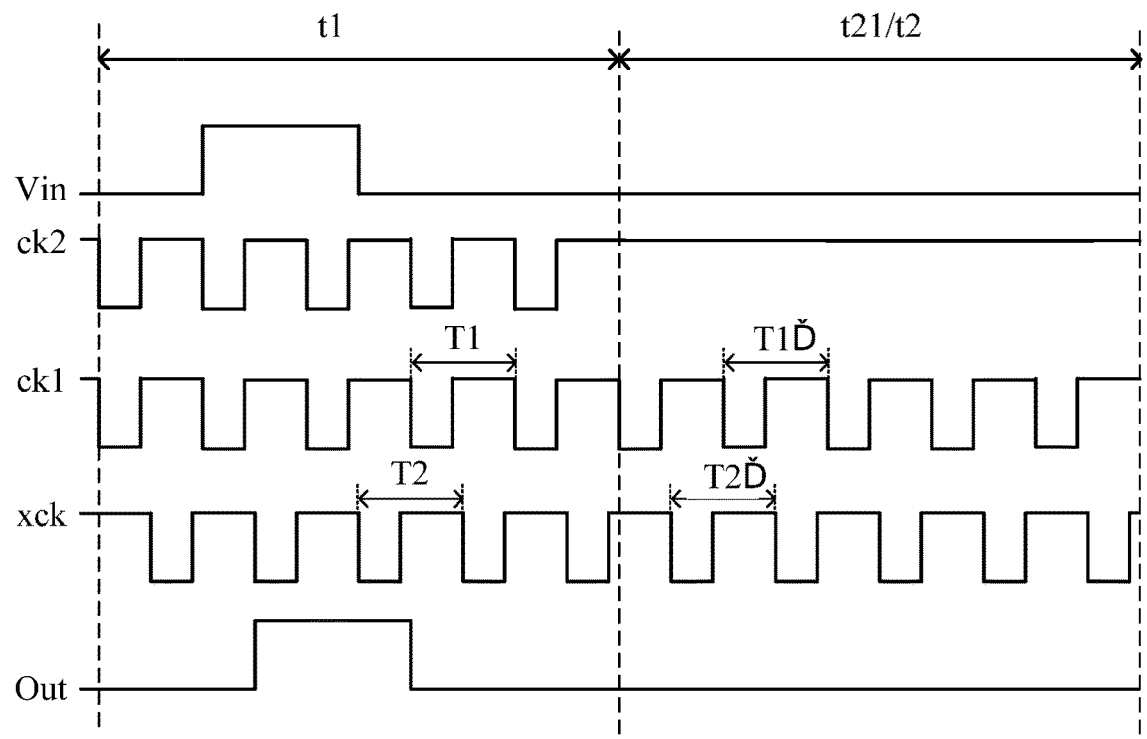
FIG. 3 is a drive timing diagram of a shift register circuit according to an embodiment of the present disclosure.

With continued reference to FIG. 3, the first clock signal ck1 may be a pulse signal in which a high-level signal (for example, vgh) and a low-level signal (for example, vgl) alternate. Similarly, the second clock signal xck may also be a pulse signal in which the high-level signal vgh and the low-level signal vgl alternate. Normally, a high-level signal vgh and a low-level signal vgl continuous with the high-level signal vgh constitute a pulse cycle. The time period of the effective pulse of the second clock signal xck does not overlap the time period of the effective pulse of the first clock signal ck1. That is, the enable level of the second clock signal xck does not overlap the enable level of the first clock signal ck1. Thus, when the first clock signal ck1 is a high-level signal vgh, the second clock signal xck may be a low-level signal vgl. Alternatively, when the first clock signal ck1 is a low-level signal vgl, the second clock signal xck may be a high-level signal vgh. It is to be understood that the enable level corresponding to the effective pulse of the first clock signal ck1 and the enable level corresponding to the effective pulse of the second clock signal xck may be set as desired. This is not specifically limited in this embodiment of the present disclosure.

It is also to be understood that when the third clock signal ck2 includes multiple effective pulses, the third clock signal ck2 may also be a pulse signal in which a high-level signal (for example, vgh) and a low-level signal (for example, vgl) alternate. The effective pulse of the third clock signal ck2 is an enable level corresponding to the third clock signal ck2. The time period of the effective pulse of the third clock signal ck2 may overlap the time period of the effective pulse of the first clock signal ck1. That is, the enable level of the third clock signal ck2 overlaps the enable level of the first clock signal ck1. Thus, the first clock signal ck1 and the third clock signal ck2 may both be high-level signals vgh or low-level signals vgl. The enable level corresponding to the effective pulse of the first clock signal ck1 and the enable level corresponding to the effective pulse of the third clock signal ck2 may be set as desired. This is not specifically limited in this embodiment of the present disclosure.

The first level signal Vg1 of the first level terminal VGL and the second level signal Vgh of the second level terminal VGH may be fixed signals. For example, when the first level signal Vg1 of the first level terminal VGL is a low-level signal (for example, vgl), the second level signal Vgh of the second level terminal VGH may be a high-level signal (for example, vgh). Alternatively, when the first level signal Vg1 of the first level terminal VGL is a high-level signal vgh, the second level signal Vgh of the second level terminal VGH may be a low-level signal vgl. It is to be understood that the first level signal Vg1 of the first level terminal VGL and the second level signal Vgh of the second level terminal VGH may be set as desired. This is not specifically limited in this embodiment of the present disclosure.

It is also to be understood that when the shift register circuit is applied to the display panel, the display panel maintains the same display image for a long time period at a lower refresh rate. At this time, the display panel may have a longer display drive cycle without continuously refreshing the display image of the display panel. That is, the shift register circuit 10 may have a longer drive cycle such that each drive cycle of each shift register circuit 10 includes a data writing phase t1 and a retention phase t2. One display drive cycle at a lower refresh rate may be equivalent to multiple display drive cycles at a higher refresh rate. At this time, the data writing phase t1 of the shift register circuit 10 may be equivalent to one display drive cycle at a higher refresh rate. The duration of one retention phase t2 may be equivalent to at least one display drive cycle at a higher refresh rate. Thus, at a lower drive frequency, the display panel maintains the same display image for a long time period. That is, the display panel does not perform image switching for a long time period. Thus, the power consumption due to image switching can be reduced.

For example, FIG. 3 is a drive timing diagram of a shift register circuit according to an embodiment of the present disclosure. With reference to FIG. 2 and FIG. 3, in the data writing phase t1, the first control module 11 can match the potential of the first node N1 with the input signal Vin under the control of the effective pulse of the first clock signal ck1. Since the time period of the effective pulse of the first clock signal ck1 does not overlap the time period of the effective pulse of the second clock signal xck, when the first clock signal ck1 is an enable level, the first control module 11 can transmit the input signal Vin to the first node N1 under the control of the first clock signal ck1. When the first clock signal ck1 is a disable level, the second clock signal xck is an enable level. At this time, the first control module 11 cannot transmit the input signal Vin to the first node N1 under the control of the first clock signal ck1. However, the first control module 11 can, under the control of the effective pulse of the second clock signal xck, control the potential of the first node N1 to match the enable level of the effective pulse of the second clock signal xck so that the potential of the first node N1 continues to be stable at the enable level. Thus, the output module 13 can transmit the first level signal Vg1 of the first level terminal VGL to the signal output terminal OUT under the control of the potential of the first node N1. That is, the output signal Out is the first level signal Vg1. At the same time, in the data writing phase t1, the third clock signal ck2 includes multiple effective pulses, the time period of the effective pulses of the third clock signal ck2 overlaps the time period of the effective pulses of the first clock signal ck1, and the second control module 12 controls the potential of the second node N2 according to the potential of the first node N1 under the control of the third clock signal ck2 and the first level signal Vg1. Thus, when the potential of the second node N2 is an enable level, the output module 13 can be controlled to transmit the second level signal Vgh of the second level terminal VGH to the signal output terminal OUT. That is, the output signal Out is the second level signal Vgh. In this manner, second level signals Vgh outputted from signal output terminals OUT of the shift register circuits 10 at all stages in the shift register 100 are sequentially shifted.

When the shift register circuit 10 enters to the retention phase t2, the retention phase t2 may include at least one first retention frame t21. During the entire retention phase t2, the output module 13 of the shift register circuit 10 maintains the output signal Out of the signal output terminal OUT at the first level signal Vg1 for a long time period under the control of the potential of the first node N1. Thus, the display panel including the shift register maintains the same display image for a long time period. In this case, the potential of the second node N2 can be remained at a disable level. That is, the second node N2 and nodes associated with the second node need not be repeatedly charged and discharged. In this manner, at least in the first retention frame t21 of the retention phase t2, the third clock signal ck2 may be an ineffective fixed level, that is, the third clock signal ck2 is remained a disable level to avoid repeatedly charging and discharging the potential of the nodes in the second control module 12, thereby avoiding the waste of the power consumption. This is conducive to reducing the power consumption of the shift register, thereby facilitating the low power consumption of the display panel.

Optionally, with continued reference to FIG. 3, for the third clock signal ck2, the time period to maintain an ineffective fixed level in the first retention frame t21 is at least longer than the time interval between two adjacent effective pulses in the data writing phase t1.

For example, the time interval between two adjacent effective pulses of the third clock signal ck2 in the data writing phase t1 is the time period in which the third clock signal ck2 is an ineffective fixed level in the first retention frame t21. It is to be understood that each time the third clock signal ck2 generates a transition of the effective pulse, the potential of the nodes in the second control module 12 is charged or discharged once. When it is set that the time period for the third clock signal ck2 to maintain an ineffective fixed level in the first retention frame t21 is longer than the time interval between two adjacent effective pulses of the third clock signal ck2 in the data writing phase t1, the third clock signal ck2 can be maintained as an ineffective fixed level for a long time period. Thus, the number of times of the transition of the third clock signal ck2 can be reduced, thereby reducing the number of times of repeatedly charging and discharging the potential of the nodes in the second control module 12, and further reducing the power consumption of the shift register circuit.

The longer the time for the third clock signal ck2 to maintain the ineffective fixed level in the first retention frame t21 is, the more power consumption is saved. In an optional embodiment, the entire retention phase t2 is the first retention frame t21. At this time, the third clock signal ck2 is remained the ineffective fixed level in the entire retention phase t2 so that the power consumption can be saved to the maximum extent.

Figure 4:
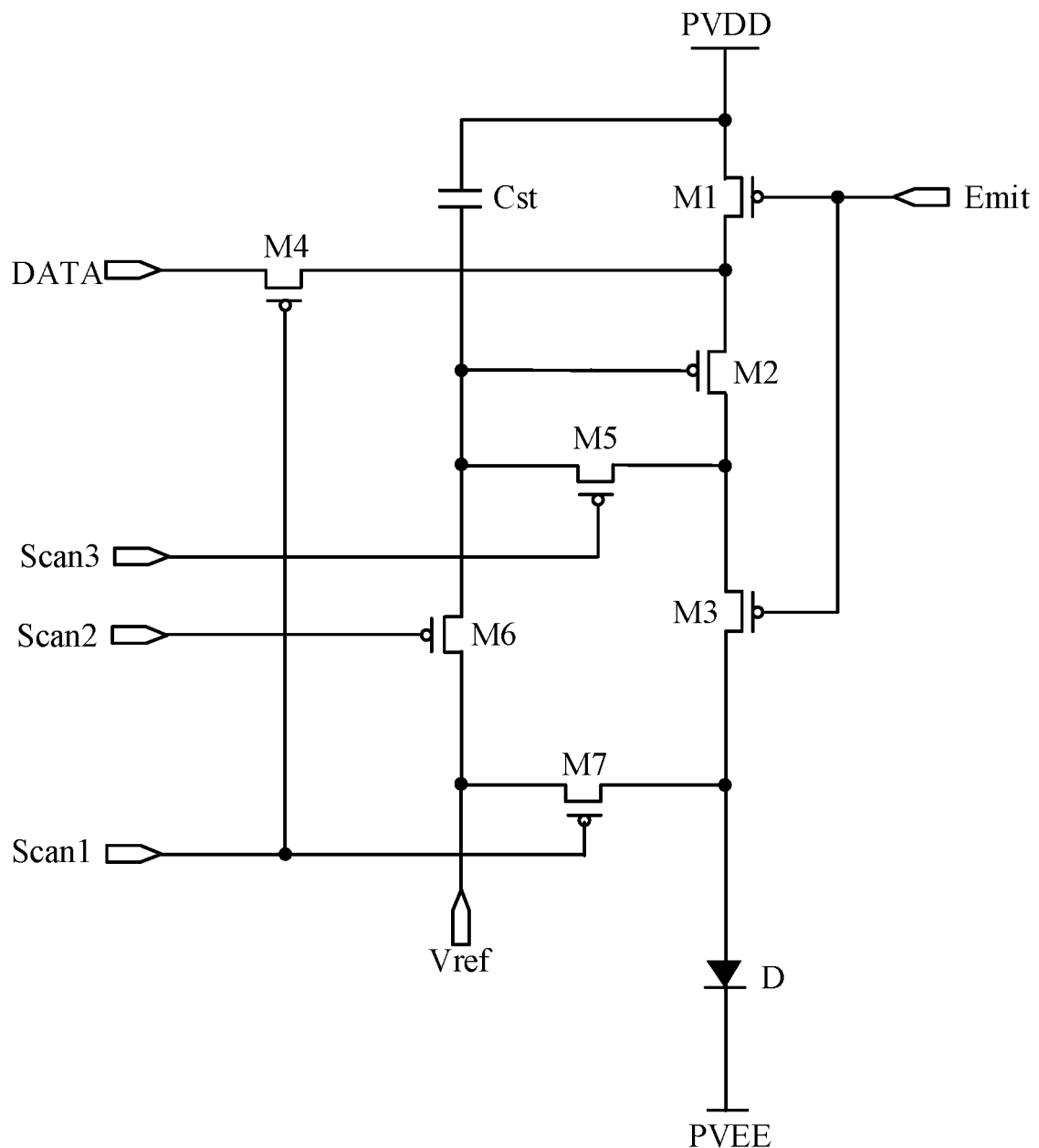
FIG. 4 is a diagram illustrating the structure of a pixel circuit according to an embodiment of the present disclosure.

In an optional embodiment, when the shift register 100 is applied to the display panel, the signals outputted from the shift register circuit 10 at each of stages in the shift register 100 can control transistors of pixel circuits in the display region of the display panel to be on or off. Exemplarily, FIG. 4 is a diagram illustrating the structure of a pixel circuit according to an embodiment of the present disclosure. As shown in FIG. 4, a pixel circuit in the display region of a display panel may be a typical 7T1C circuit. In this case, the pixel circuit may include a drive transistor M2, an initialization transistor M6, a threshold compensation transistor M5, a data write transistor M4, a first light emission control transistor M1, a second light emission control transistor M3, a reset transistor M7, and a storage capacitor Cst. It is to be understood that the seven transistors in the pixel circuit are turned on or off under the control of corresponding scan signals (Scan1, Scan2, and Scan3) and light emission control signal Emit to control the on and off of the transmission paths of a data signal Vdata, an initialization signal, and a reset signal Vref and the time point at which a drive current is supplied to a light-emitting element D. Exemplarily, FIG. 4 shows that the seven transistors are each a p-type transistor. However, this is not limited thereto. With continued reference to FIG. 4, the signals outputted from the shift register circuit 10 at each of stages in the shift register 100 may be used for controlling the first light emission control transistor M1 and the second light emission control transistor M3 to be on or off.

Figure 5:
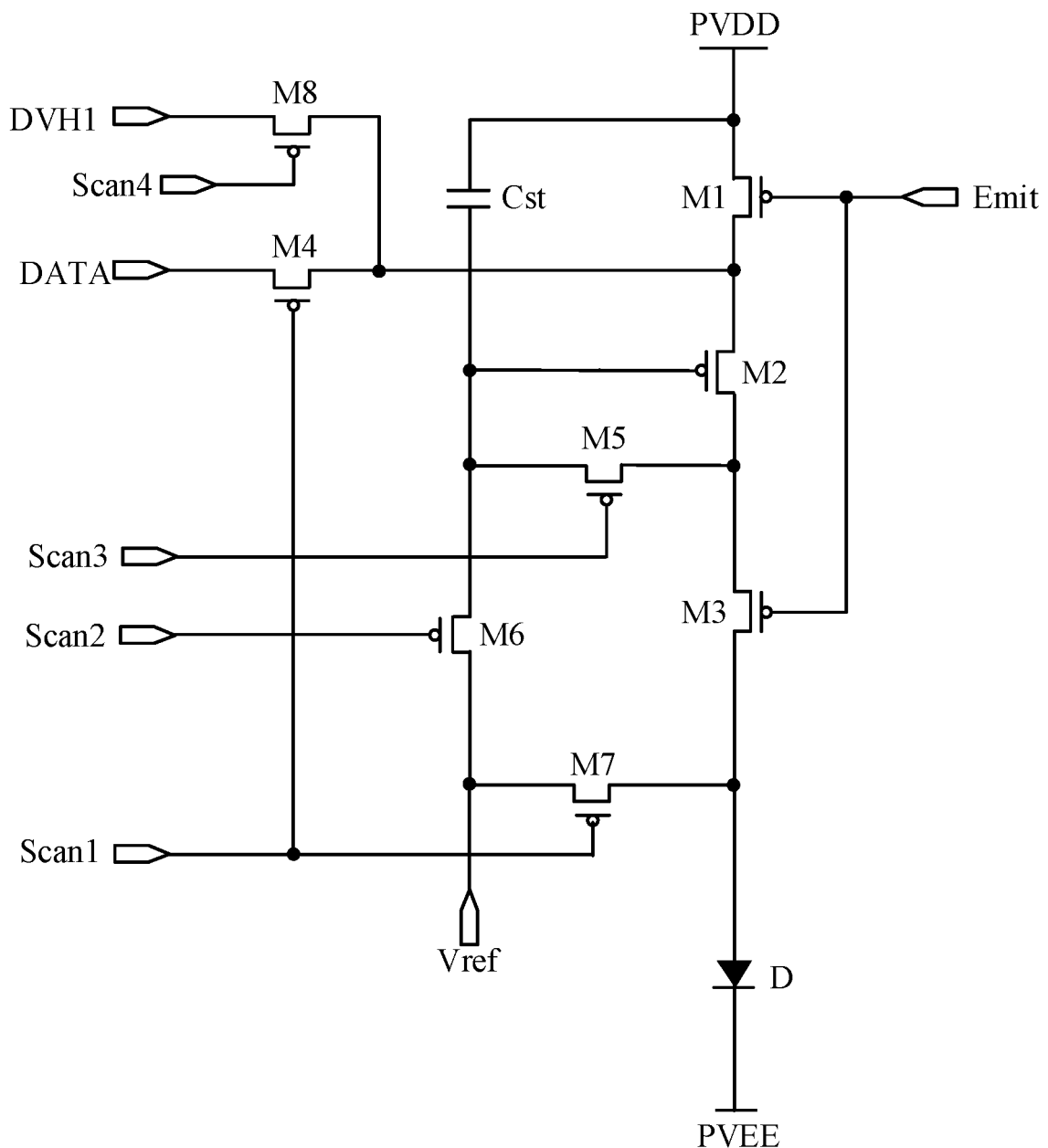
FIG. 5 is a diagram illustrating the structure of another pixel circuit according to an embodiment of the present disclosure.

In another optional embodiment, FIG. 5 is a diagram illustrating the structure of another pixel circuit according to an embodiment of the present disclosure. As shown in FIG. 5, different from FIG. 4, the pixel circuit also includes a bias adjustment transistor M8. The bias adjustment transistor M8 can be turned on or off under the control of a scan signal Scan4. A bias adjustment signal DVH is written to the gate of a drive transistor M2 when the bias adjustment transistor M8 is turned on. In the pixel circuit, a threshold compensation transistor M5 and an initialization transistor M6 are each a n-type transistor, and other transistors are p-type transistors. In this case, the signals outputted from the shift register circuit 10 at each of stages in the shift register 100 can be used for controlling the turn-on or turn-off of the initialization transistor M6 and/or threshold compensation transistor M5 or can also be used for controlling the turn-on or turn-off of the first light emission control transistor M1 and/or the second light emission control transistor M3.

With reference to FIGS. 2, 4, and 5, if the signals outputted from the shift register circuit 10 at each of stages in the shift register 100 are used for controlling the turn-on or turn-off of the initialization transistor M6 and/or threshold compensation transistor M5, that is, the signal outputted from a shift register circuit 10 at each stage is a scan signal Scan3 and/or a scan signal Scan2, when the output module 13 transmits the second level signal Vgh of the second level terminal VGH to the signal output terminal OUT, the output signal Out of the shift register circuit 10 can be considered as an enable level capable of controlling the turn-on of the transistors in the pixel circuit of the display panel. When the output module 13 transmits the first level signal Vgl of the first level terminal VGL to the signal output terminal OUT, the output signal Out of the shift register circuit 10 can be considered as a disable level capable of controlling the turn-off of the transistors in the pixel circuit of the display panel.

If the signals outputted from the shift register circuit 10 at each of stages in the shift register 100 are used for controlling the turn-on or turn-off of the first light emission control transistor M1 and/or the second light emission control transistor M3, that is, the signal outputted from a shift register circuit 10 at each stage is a light emission control signal Emit, when the output module 13 transmits the first level signal Vgl of the first level terminal VGL to the signal output terminal OUT, the output signal Out of the shift register circuit 10 can be considered as an enable level capable of controlling the turn-on of the transistors in the pixel circuit of the display panel. When the output module 13 transmits the second level signal Vgh of the second level terminal VGH to the signal output terminal OUT, the output signal Out of the shift register circuit 10 can be considered as a disable level capable of controlling the turn-off of the transistors in the pixel circuit of the display panel.

It is to be noted that the preceding only takes the signals outputted from the shift register circuit 10 at each of stages in the shift register 100 for controlling the transistors in the pixel circuit as an example. Devices controlled by signals outputted from the shift register circuit 10 at each of stages in this embodiment of the present disclosure are not limited thereto. Moreover, the structure of the pixel circuit is not limited thereto and may be designed as required. These are not specifically limited in this embodiment of the present disclosure.

It is to be understood that the enable level and the disable level are related to the types of transistors controlled by the enable level and the disable level. For example, when a transistor is a p-channel transistor, the enable level is a low-level signal, and the disable level is a high-level signal. When a transistor is an n-channel transistor, the enable level is a high-level signal, and the disable level is a low-level signal. The enable level and the disable level may be limited according to actual requirements in this embodiment of the present disclosure. For ease of description, without specific description, this embodiment of the present disclosure is described by taking an effective pulse as an enable level, an enable level as a low-level signal, and a disable level as a high-level signal as an example.

It is also to be understood that in this embodiment of the present disclosure, the third clock signal is mainly used for charging or discharging the second control module of the shift register circuit. When the third clock signal is an ineffective fixed level, the second control module is not charged or discharged. At this time, the second control module can be kept in a non-working state, thereby implementing the low power consumption of the shift register circuit. Accordingly, on the premise that the low power consumption of the shift register circuit is implemented when the third clock signal is remained an ineffective fixed level, the structure of the second control module is not specifically limited in this embodiment of the present disclosure.

Figure 6:
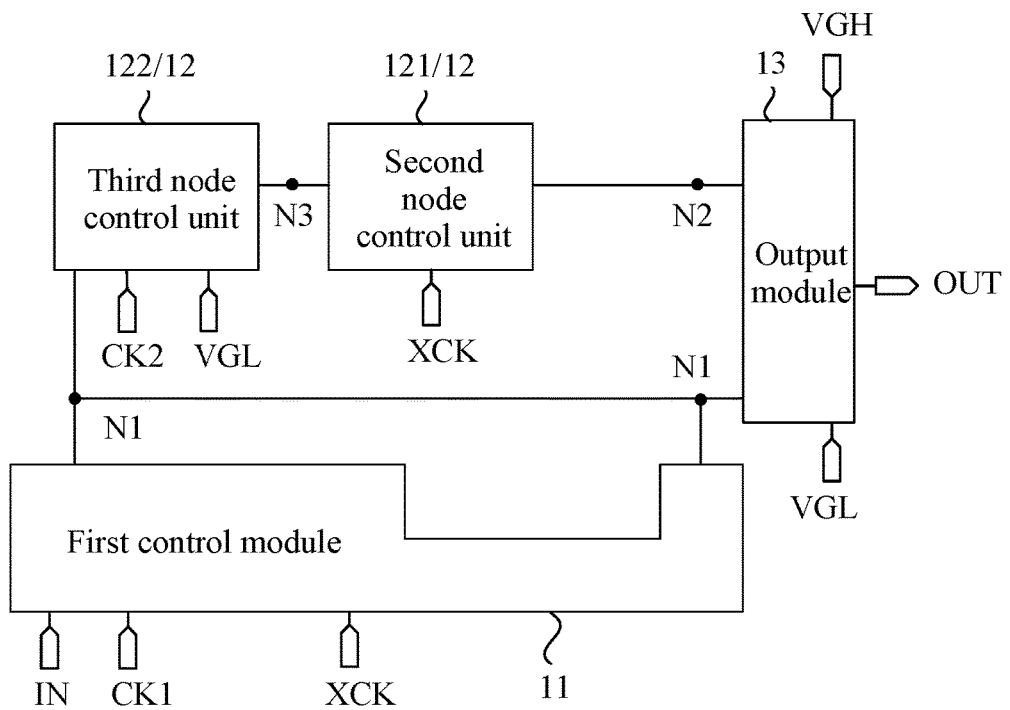
FIG. 6 is a diagram illustrating the structure of another shift register circuit according to an embodiment of the present disclosure.

Optionally, FIG. 6 is a diagram illustrating the structure of another shift register circuit according to an embodiment of the present disclosure. As shown in FIG. 6, a second control module 12 includes a second node control unit 121 and a third node control unit 122. In the same shift register circuit 10, the third node control unit 122 and the second node control unit 121 are electrically connected to a third node N3. The third node control unit 122 is also electrically connected to a first node N1, a third clock terminal CK2, and a first level terminal VGL, separately. The third node control unit 122 is configured to control, under the control of the potential of the first node N1, the time point at which a third clock signal ck2 is transmitted to the third node N3 and control, under the control of the third clock signal ck2, the time point at which a first level signal Vg1 is transmitted to the third node N3. The second node control unit 121 is also electrically connected to a second clock terminal XCK and a second node N2, separately. The second node control unit 121 is configured to control the potential of the second node N2 according to a second clock signal xck and the potential of the third node N3.

For example, the third node control unit 122 can control the transmission time point of the third clock signal ck2 to the third node N3 under the control of the potential of the first node N1 and control the transmission of the third clock signal ck2 to the third node N3 when the potential of the first node N1 is an enable level. At the same time, the third node control unit 122 controls the transmission time of the first level signal Vg1 to the third node N3 under the control of the third clock signal ck2 and controls the transmission of the first level signal Vg1 to the third node N3 when the third clock signal ck2 is an effective pulse (that is, an enable level). In this manner, the potential of the third node N3 is controlled so that the potential of the third node N3 matches the third clock signal ck2 or the first level signal Vg1. Accordingly, the second node control unit 121 controls the potential of the second node N2 under the control of the second clock signal xck and the potential of the third node N3. When the potential of the first node N1 is an enable level, the potential of the second node N2 needs to be a disable level. That is, when the first node N1 is an enable level, the second node control unit 121 should be unable to transmit the potential of the third node N3 to the second node N2. At this time, the second clock signal xck should be a disable level that controls the second node control unit 121 not to transmit the potential of the third node N3 to the second node N2.

The signal output terminal OUT of the output module 13 remains outputting the first level signal Vg1 in the retention phase t2. That is, the potential of the first node N1 is remained an enable level, while the potential of the second node N2 is a disable level. Therefore, at least in the first retention frame t21 of the retention phase t2, the third clock signal ck2 is an ineffective fixed level, that is, a disable level. Thus, the potential of the third node N3 matches the third clock signal ck2 and is also remained a disable level. In this case, potentials of the third node N3 and second node N2 electrically connected to two ends of the second node control unit 121 are both disable levels, thereby avoiding charging or discharging the second node control unit 121 and facilitating the low power consumption of the shift register.

Figure 7:
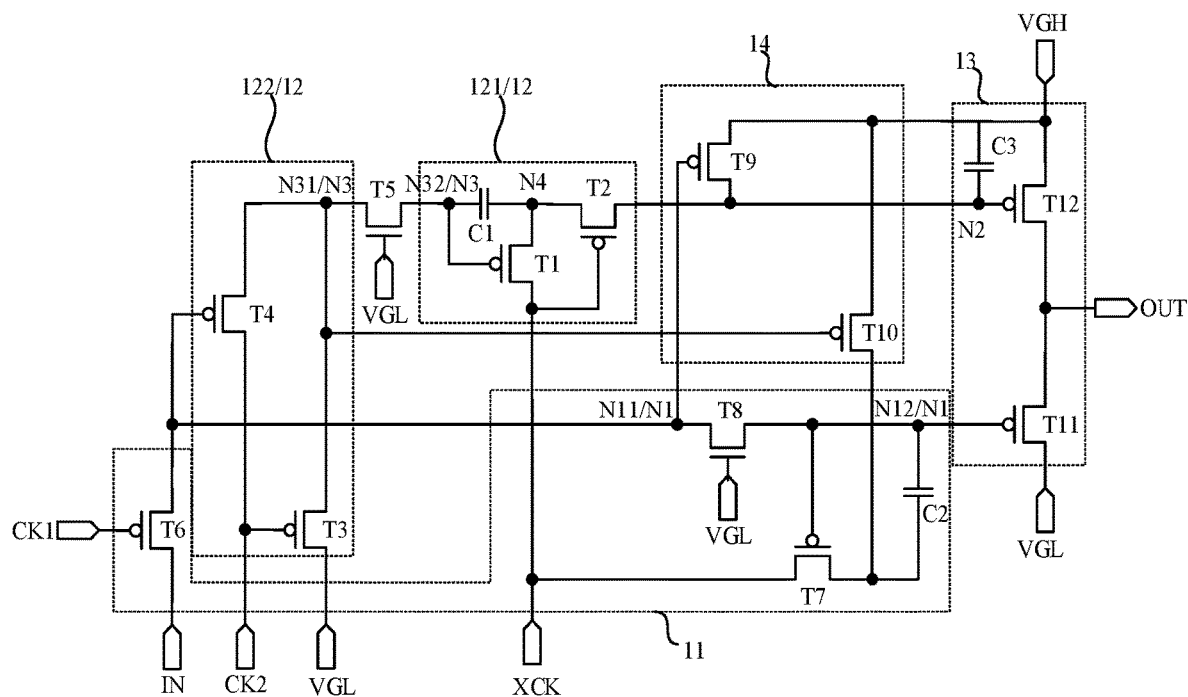
FIG. 7 is a diagram illustrating the structure of another shift register circuit according to an embodiment of the present disclosure.

Optionally, FIG. 7 is a diagram illustrating the structure of another shift register circuit according to an embodiment of the present disclosure. As shown in FIG. 7, a second node control unit 121 includes a first capacitor C1, a first transistor T1, and a second transistor T2. In the same shift register circuit 10, the first plate of the first capacitor C1 and the gate of the first transistor T1 are both coupled to a third node N3. The first terminal of the first transistor T1 is electrically connected to a second clock terminal XCK. The second terminal of the first transistor T1 is electrically connected to the second plate of the first capacitor C1. The gate of the second transistor T2 is electrically connected to the second clock terminal XCK. The first terminal of the second transistor T2 is electrically connected to the second plate of the first capacitor C1. The second terminal of the second transistor T2 is electrically connected to a second node N2.

In an optional embodiment, with continued reference to FIG. 7, a third node control unit 122 may include a third transistor T3 and a fourth transistor T4. The gate of the third transistor T3 is electrically connected to a third clock terminal CK2. The first terminal of the third transistor T3 is electrically connected to a first level terminal VGL. The second terminal of the third transistor T3 is electrically connected to the third node N3. The gate of the fourth transistor T4 is electrically connected to a first node N1. The first terminal of the fourth transistor T4 is electrically connected to the third clock terminal CK2. The second terminal of the fourth transistor T4 is electrically connected to the third node N3. In this manner, the fourth transistor T4 can be turned on or off under the control of the potential of the first node N1 and in the on state, transmit the third clock signal ck2 of the third clock terminal CK2 to the third node N3. Alternatively, the third transistor T3 can be turned on or off under the control of a third clock signal ck2 and in the on state, transmit a first level signal Vg1 to the third node N3.

For example, with reference to FIG. 3 and FIG. 7, in the data writing phase t1, the first transistor T1 can be turned on or off under the control of the potential of the third node N3. The second terminal of the first transistor T1 and the second plate of the first capacitor C1 are electrically connected to a fourth node N4. When the first transistor T1 is in the on state, the second clock signal xck is transmitted to the fourth node N4. At this time, the second transistor T2 can be turned on or off under the control of the second clock signal xck. When the second transistor T2 is in the on state, the potential of the fourth node N4 is transmitted to the second node N2. The potential of the second node N2 is set to be an enable level so that the signal output terminal OUT of the shift register circuit 10 outputs the second level signal Vgh. When the third clock signal ck2 includes multiple effective pulses, the second level signals Vgh outputted from the signal output terminals OUT of the shift register circuits 10 at different stages can be sequentially shifted. Due to the action of the first capacitor C1, the potential of the second node N2 can be remained more stably at the enable level.

In the retention phase t2, if the third clock signal ck2 is a pulse signal, in the effective pulse (that is, the enable level) phase of the third clock signal ck2, the third transistor T3 is turned on. Thus, the first level signal Vg1 is transmitted to the third node, thereby causing the first capacitor C1 to discharge. In the non-effective pulse (that is, the disable level) phase of the third clock signal ck2, the disable level of the third clock signal ck2 is transmitted through the turned-on fourth transistor T4 to the third node N3 so that the first capacitor C1 starts to charge. Thus, the pulse signal of the third clock signal ck2 repeatedly charges and discharges the first capacitor C1, thereby causing waste of power consumption. Therefore, in at least the first retention frame t21 of the retention phase t2, the third clock signal ck2 is an ineffective fixed level, that is, the third clock signal ck2 is remained a disable level. Thus, the first level signal Vg1 cannot be transmitted to the third node N3 through the third transistor T3. At the same time, the disable level of the third clock signal ck2 can be transmitted to the third node N3 in the case where the potential of the first node N1 controls the fourth transistor T4 to be turned on. At this time, the disable level of the potential of the third node N3 controls the first transistor T1 to be turned off. The second clock signal xck cannot be transmitted to the fourth node N4 through the first transistor T1. When the second clock signal xck is an enable level and controls the second transistor T2 to be turned on, the potential of the fourth node N4 is consistent with the potential of the second node N2, and both are disable levels. When the second clock signal xck is a disable level and controls the second transistor T2 to be turned off, the potential of the fourth node N4 is still remained the disable level. In this manner, the potentials of the third node N3 and fourth node N4 at two ends of the first capacitor C1 are both the disable levels, thereby avoiding repeated charging and discharging of the first capacitor C1 and facilitating the reduction of power consumption.

The first transistor T1, the second transistor T2, the third transistor T3, and the fourth transistor T4 may be each an n-channel transistor or a p-channel transistor and may be designed as required. This is not specifically limited in this embodiment of the present disclosure. It is to be noted that the structure of the third node control unit 122 is shown as an example only. This embodiment includes but is not limited to this.

Optionally, with continued reference to FIG. 7, a second control module 12 also includes a first voltage regulation transistor T5. The third node N3 includes a first child node N31 and a second child node N32. The gate of the first voltage regulation transistor T5 is electrically connected to the first level terminal VGL. The first terminal of the first voltage regulation transistor T5 is electrically connected to the first child node N31. The second terminal of the first voltage regulation transistor T5 is electrically connected to the second child node N32. The first voltage regulation transistor T5 is in the on state under the control of the first level signal Vg1. The third node control unit 122 is electrically connected to the first child node N31 of the third node N3. The second node control unit 121 is electrically connected to the second child node N32 of the third node N3.

For example, FIG. 7 exemplarily shows that the first voltage regulation transistor T5 is a p-channel transistor. The first level signal Vg1 controls the first voltage regulation transistor T5 to be in the on state. Thus, the original potential of the third node N3 can be allocated at the first child node N31 and the second child node N32, thereby avoiding a change in the third node N3 due to the joint action of the third node control unit 122 and the second node control unit 121, which affects the working of the shift register circuit 10. Thus, by providing the first voltage regulation transistor T5, when the potential of one of the first child node N31 and the second child node N32 is abnormal, the device electrically connected to the other node can be protected.

In an optional embodiment, with continued reference to FIG. 7, a first control module 11 includes a first input transistor T6, a switch transistor T7, a second voltage regulation transistor T8, and a second capacitor C2. The gate of the first input transistor T6 is electrically connected to a first clock terminal CK1. The first terminal of the first input transistor T6 is electrically connected to a signal input terminal IN. The second terminal of the first input transistor T6 is electrically connected to the first node N1. Thus, the first clock signal ck1 of the first clock terminal CK1 can control the first input transistor T6 to be on or off to transmit the input signal Vin of the signal input terminal IN to the first node N1 when the first input transistor T6 is in the on state.

The first node N1 may include a third child node N11 and a fourth child node N12. The gate of the second voltage regulation transistor T8 is electrically connected to the first level terminal VGL. The first terminal of the second voltage regulation transistor T8 is electrically connected to the third child node N11. The second terminal of the second voltage regulation transistor T8 is electrically connected to the fourth child node N12. The second voltage regulation transistor T8 is in the on state under the control of the first level signal Vg1. It is to be understood that the action of the second voltage regulation transistor T8 is the same as the action of the first voltage regulation transistor T5. The details are not repeated here.

The gate of the switch transistor T7 is electrically connected to the fourth child node N12 of the first node N1. The first terminal of the switch transistor T7 is electrically connected to the second clock terminal XCK. The second terminal of the switch transistor T7 is electrically connected to the first plate of the second capacitor C2. The second plate of the second capacitor C2 is electrically connected to the fourth child node N12 of the first node N1. The switch transistor T7 is configured to control the second clock signal xck to transmit to the first plate of the second capacitor C2 at least when the potential of the first node N1 is an enable level that controls an output module 13 to transmit the first level signal Vg1 to the signal output terminal OUT. Moreover, after the second clock signal xck transitions from a high-level signal vgh to a low-level signal vgl, the potential of the first node N1 can be pulled down to a potential equivalent to the potential of the second clock signal xck through the coupling action of the second capacitor C2. Thus, the potential of the first node N1 is continuously stabilized at a lower potential so that the signal output terminal OUT stably outputs the first level signal Vg1.

It is to be noted that the structure of the first control module 11 includes but is not limited to that shown in FIG. 7. This can be set according to actual requirements. FIG. 7 is shown as an example only.

Figure 8:
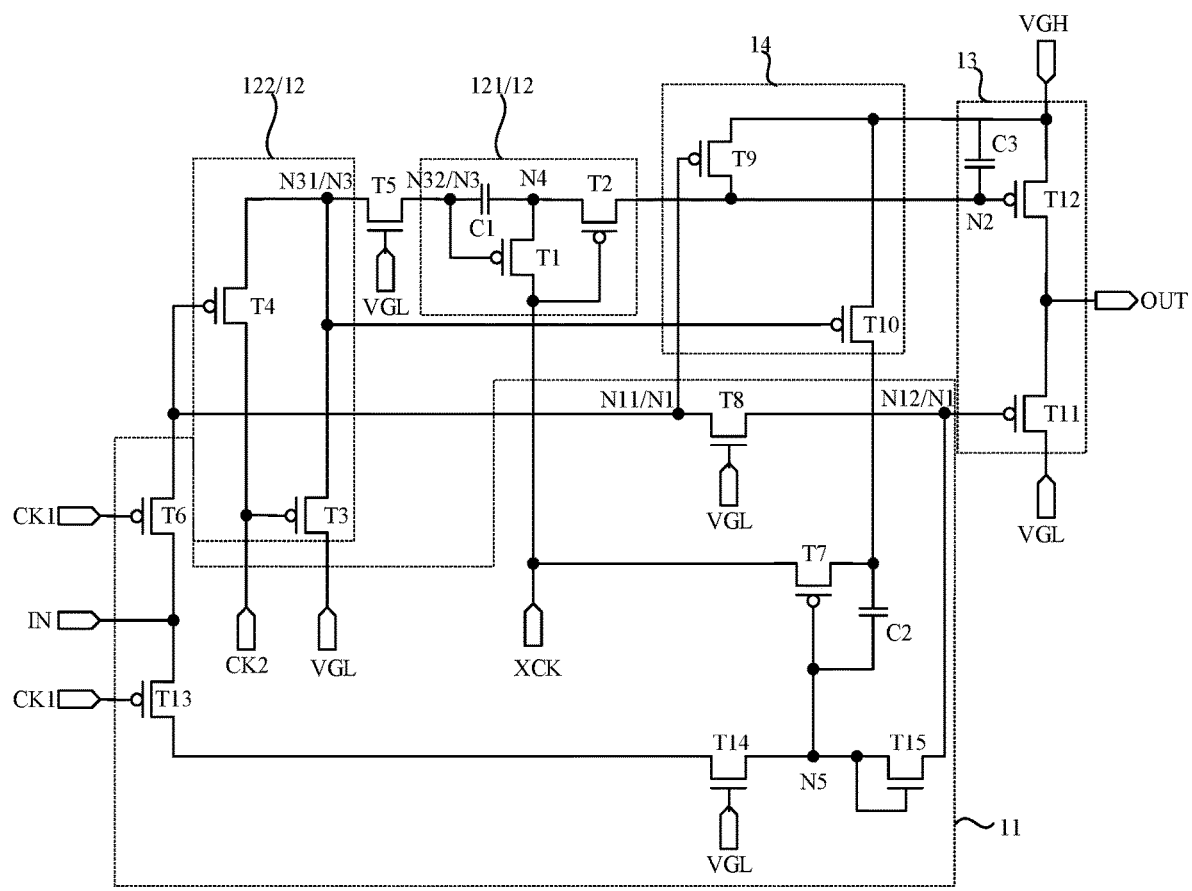
FIG. 8 is a diagram illustrating the structure of another shift register circuit according to an embodiment of the present disclosure.

In another optional embodiment, as shown in FIG. 8, different from in FIG. 7, a first control module 11 may also include a second input transistor T13, a third voltage regulation transistor T14, and a filter transistor T15. The gate of the second input transistor T13 is electrically connected to a first clock terminal CK1. The first terminal of the second input transistor T13 is electrically connected to a signal input terminal IN. The second terminal of the second input transistor T13 is electrically connected to the first terminal of the third voltage regulation transistor T14. In this manner, the first clock signal ck1 of the first clock terminal CK1 can control the second input transistor T13 to be on or off to transmit the input signal Vin of the signal input terminal IN to the first terminal of the third voltage regulation transistor T14 when the second input transistor T13 is in the on state. The second terminal of the third voltage regulation transistor T14 and the gate of a switch transistor T7 are electrically connected to a fifth node N5. The gate of the third voltage regulation transistor T14 is electrically connected to a first level terminal VGL. The third voltage regulation transistor T14 is in the on state under the control of a first level signal Vg1. It is to be understood that the action of the third voltage regulation transistor T14 is the same as the action of the first voltage regulation transistor T5 and the action of the second voltage regulation transistor T8. The details are not repeated here.

The second terminal of the switch transistor T7 is electrically connected to the first plate of a second capacitor C2. The gate of the switch transistor T7 is electrically connected to the second plate of the second capacitor C2. The gate of the filter transistor T15 is electrically connected to the drain of the filter transistor T15. The source of the filter transistor T15 is electrically connected to the fourth child node N12 of a first node N1. The drain of the filter transistor T15 is electrically connected to the fifth node N5. It is to be understood that the gate of the filter transistor T15 is electrically connected to the drain of the filter transistor T15. The filter transistor T15 may correspond to a diode having a unidirectional conduction performance. For example, the switch transistor T7 is turned on when the potential of the fifth node N5 is a low level vgl. When a second clock signal xck transitions to an enable level (that is, the low level vgl), the potential of the fifth node N5 is pulled low under the coupling action of the second capacitor C2. Since the potential of the first node N1 previously is a disable level (that is, a high level vgh), at this time, the potential difference between the fourth child node N12 of the first node N1 and the fifth node N5 is the forward bias for turning on the filter transistor T15 so that the filter transistor T15 is in the on state. Then, the high level vgh of the fourth child node N12 is written to the fifth node N5 so that the switch transistor T7 is turned off. The coupling action of the second capacitor C2 does not affect the stability of the potential of the fourth child node N12, thereby ensuring the stable output of the signal output terminal OUT in an output module 13. In addition, when the output of the signal output terminal OUT transitions from a second level signal Vgh (that is, a high level vgh) to the first level signal Vg1 (that is, a low level vgl), the input signal Vin (that is, a low level vgl) of the signal input terminal IN is written to the fifth node N5 so that the potential difference between the fourth child node N12 and the fifth node N5 is reverse bias controlling the filter transistor T15 to be off. That is, the filter transistor T15 is in the off state. Even if the second clock signal xck (that is, a high level vgh) of a second clock terminal XCK pulls the potential of the fifth node N5 high under the coupling action of a first capacitor C1, since the filter transistor T15 is always in the off state, the potential of the fourth child node N12 is continuously stabilized at a lower potential, thereby improving the stability of the potential of the fourth child node N12 of the first node N1.

Optionally, with continued reference to FIG. 7 or FIG. 8, the shift register circuit 10 also includes an interlock module 14. In the same shift register circuit 10, the interlock module 14 is electrically connected to a second level terminal VGH, the first control module 11, and the second control module 12, respectively. The interlock module 14 is configured to control, under control of the first control module 11, the time point at which the second level signal Vgh is transmitted to the second node N2 and control, under control of the second control module 12, the time point at which the second level signal Vgh is transmitted to the first node N1.

Exemplarily, the interlock module 14 shown in FIG. 7 or FIG. 8 includes a first interlock transistor T9 and a second interlock transistor T10. The gate of the first interlock transistor T9 is electrically connected to the third child node N11 of the first node N1. The first terminal of the first interlock transistor T9 is electrically connected to the second level terminal VGH. The second terminal of the first interlock transistor T9 is electrically connected to the second node N2. The gate of the second interlock transistor T10 is electrically connected to the first child node N31 of the third node N3. The first terminal of the second interlock transistor T10 is electrically connected to the second level terminal VGH. The second terminal of the second interlock transistor T10 is electrically connected to the first plate of the second capacitor C2.

In this manner, the first interlock transistor T9 may be turned on or off under the control of the potential of the first node N1. Moreover, when turned on, the first interlock transistor T9 transmits the second level signal Vgh to the second node N2. The second interlock transistor T10 may be turned on or off under the control of the potential of the third node N3. Moreover, when turned on, the second interlock transistor T10 transmits the second level signal Vgh to the first node N1 through the second capacitor C2. Thus, the mutual clamping of the first node N1 and the second node N2 is implemented. It is to be understood that after the second level signal Vgh is transmitted to the first node N1 through the second capacitor C2, the potential of the first node N1 is raised to a potential equivalent to the potential of the second level signal Vgh through the coupling action of the second capacitor C2, and the potential of the first node N1 is stabilized.

Optionally, with continued reference to FIG. 7 or FIG. 8, the output module 13 includes a first output transistor T11 and a second output transistor T12. The gate of the first output transistor T11 is electrically connected to the first node N1. The first terminal of the first output transistor T11 is electrically connected to the first level terminal VGL. The second terminal of the first output transistor T11 is electrically connected to the signal output terminal OUT. The gate of the second output transistor T12 is electrically connected to the second node N2. The first terminal of the second output transistor T12 is electrically connected to the second level terminal VGH. The second terminal of the second output transistor T2 is electrically connected to the signal output terminal OUT.

It is to be understood that the output module 13 also includes a third capacitor C3 electrically connected between the second level terminal VGH and the second node N2 to store the potential of the second node N2 and maintain the stability of the potential of the second node N2.

The channel types of the first output transistor T11 and the second output transistor T12 may be the same or different. This embodiment of the present disclosure is not limited thereto. When the first output transistor T11 is a p-channel transistor, the enable level of the first node N1 controlling the first output transistor T11 to be on is a low-level signal vgl. Thus, the first level signal Vg1 of the first level terminal VGL is transmitted to the signal output terminal OUT. The disable level of the first node N1 controlling the first output transistor T11 to be off is a high-level signal vgh. When the first output transistor T11 is an n-channel transistor, the enable level of the first node N1 controlling the first output transistor T11 to be on is a high-level signal vgh. Thus, the first level signal Vg1 of the first level terminal VGL is transmitted to the signal output terminal OUT. The disable level of the first node N1 controlling the first output transistor T11 to be off is a low-level signal vgl. Similarly, when the second output transistor T12 is a p-channel transistor, the enable level of the second node N2 controlling the second output transistor T12 to be on is a low-level signal vgl. Thus, the second level signal Vgh of the second level terminal VGH is transmitted to the signal output terminal OUT. The disable level of the second node N2 controlling the second output transistor T12 to be off is a high-level signal vgh. When the second output transistor T12 is an n-channel transistor, the enable level of the second node N2 controlling the second output transistor T12 to be on is a high-level signal vgh. Thus, the second level signal Vgh of the second level terminal VGH is transmitted to the signal output terminal OUT. The disable level of the second node N2 controlling the second output transistor T12 to be off is a low-level signal vgl.

It is to be noted that FIG. 7 and IG. 8 show only the structure diagrams illustrating that each transistor is a p-channel transistor, but are not limited thereto. Those skilled in the art may design according to requirements. This is not specifically limited in the present disclosure. For ease of description, the technical solutions of the embodiments of the present disclosure are described in the following by using an example in which each transistor in the shift register circuit 10 is a p-channel transistor.

Optionally, with continued reference to FIG. 3, a clock cycle of the first clock signal ck1 in the retention phase t2 is the same as a clock cycle of the first clock signal ck1 in the data writing phase t1. Moreover, the width of the effective pulse of the first clock signal ck1 in the retention phase t2 is the same as the width of the effective pulse of the first clock signal ck1 in the data writing phase t1. Moreover/alternatively, the clock cycle of the second clock signal xck in the retention phase t2 is the same as the clock cycle of the second clock signal xck in the data writing phase t1. Moreover, the width of the effective pulse of the second clock signal xck in the retention phase t2 is the same as the width of the effective pulse of the second clock signal xck in the data writing phase t1.

For example, the first input transistor T6 in the first control module 11 may be controlled by the effective pulse of the first clock signal ck1 such that the potential of the first node N1 matches the input signal Vin. That is, the potential of the first node N1 is directly controlled by the first clock signal ck1. A clock cycle of the first clock signal ck1 in the data writing phase t1 is T1. A clock cycle of the first clock signal ck1 in the retention phase t2 is T1'. T1 is the same as T1'. The width of an effective pulse in T1 is the same as the width of an effective pulse in T1'. Thus, the first clock signal ck1 has the same transition frequency in the data writing phase t1 and the retention phase t2. Further, the first control module 11 is capable of controlling the first node N1 in the data writing phase t1 and the retention phase t2 in a consistent manner, thereby ensuring that the signal output terminal OUT of the shift register circuit 10 outputs the same first level signal Vg1 at the potential of the first node N1, and ensuring that the shift register circuit 10 can work normally in the data writing phase t1 and the retention phase t2.

Similarly, the switch transistor T7 in the first control module 11 can transmit the second clock signal xck to the first plate of the second capacitor C2 under the control of the potential of the first node N1. Thus, the potential of the first node N1 is continuously stabilized at a lower potential through the coupling effect of the second capacitor C2 after the second clock signal xck transitions from a high-level signal vgh to a low-level signal vgl, ensuring that the signal output terminal OUT stably outputs the first level signal Vg1, that is, the potential of the first node N1 and the output signal of the signal output terminal OUT are also controlled by the transition of the second clock signal xck. A clock cycle of the second clock signal xck in the data writing phase t1 is T2. A clock cycle of the second clock signal xck in the retention phase t2 is T2'. T2 is the same as T2'. The width of an effective pulse in T2 is the same as the width of an effective pulse in T2'. Thus, the second clock signal xck has the same transition frequency in the data writing phase t1 and the retention phase t2. Further, the first control module 11 is capable of controlling the first node N1 in the data writing phase t1 and the retention phase t2 in a consistent manner, thereby ensuring that the signal output terminal OUT of the shift register circuit 10 outputs the same first level signal Vg1 at the potential of the first node N1, and ensuring that the shift register circuit can work normally in the data writing phase t1 and the retention phase t2.

Figure 9:
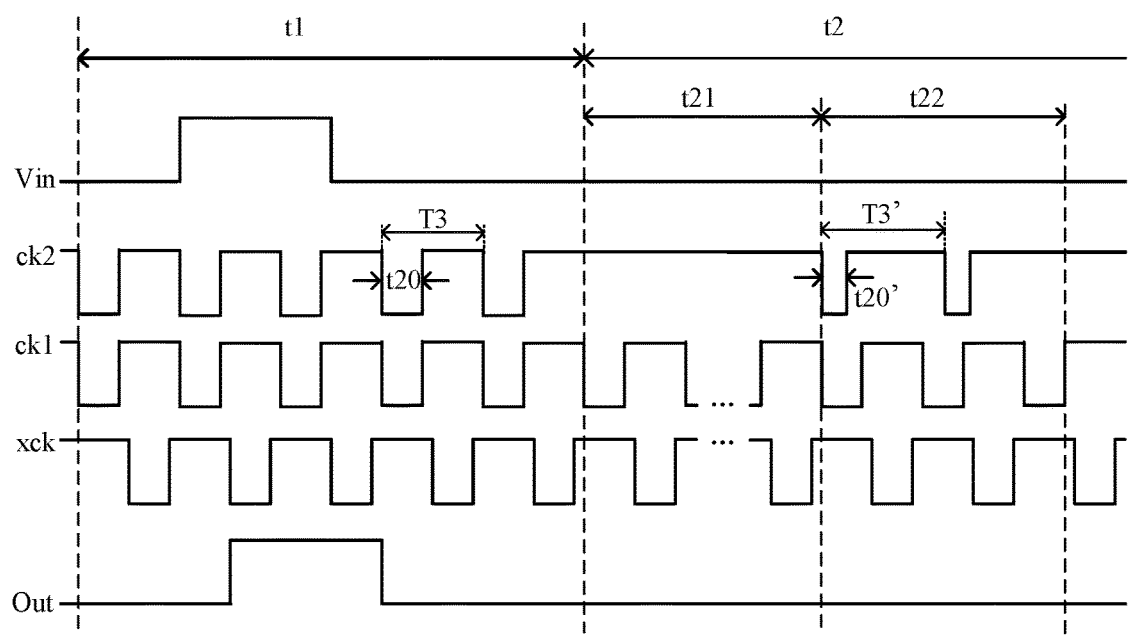
FIG. 9 is a drive timing diagram of another shift register circuit according to an embodiment of the present disclosure.

Optionally, FIG. 9 is a drive timing diagram of another shift register circuit according to an embodiment of the present disclosure. As shown in FIG. 9, a retention phase t2 also includes at least one second retention frame t22. In the second retention frame t22, a third clock signal ck2 includes at least one effective pulse.

It is to be understood that for a long time period of the retention phase t2, if the potential of a third node N3 is remained an ineffective fixed level for a long time period, that is, the potential of the gate of a first transistor T1 is remained a disable level for a long time period, there is a voltage difference between the gate of the first transistor T1 and the source (or the drain) of the first transistor T1 for a long time period. Thus, the first transistor T1 is in a bias state for a long time period. When the first transistor T1 works in the bias state for a long time period, the threshold voltage of the first transistor T1 drifts, and the hysteresis effect is produced. When the potential of the third node N3 is an enable level, the first transistor T1 cannot be completely turned on, affecting the transmission of the enable level of a second pulse signal xck to a second node N2, thereby affecting the stable output of the signal output terminal OUT of an output module 13.

Therefore, in the second retention frame t22 of the retention phase t2, the third clock signal ck2 is set to include at least one effective pulse. Thus, the third transistor T3 in a third node control unit 122 is turned on under the control of the effective pulse of the third clock signal ck2, and a first level signal Vg1 is transmitted to the third node N3. The bias state of the first transistor T1 is adjusted, thereby slowing down the hysteresis effect of the first transistor T1. Thus, the second node N2 can provide a stable enable level, and a second level signal Vgh is controlled to be stably outputted at the signal output terminal of a shift register circuit 10.

It is to be noted that FIG. 9 only exemplarily shows a drive timing diagram in which the third clock signal ck2 includes two effective pulses in the second retention frame t22. The number of pulses of the third clock signal ck2 may be set according to actual requirements. This is not specifically limited in this embodiment of the present disclosure.

Optionally, with continued reference to FIG. 9, the width of an effective pulse of the third clock signal ck2 in the second retention frame t22 is less than or equal to the width of an effective pulse of the third clock signal ck2 in the data writing phase t1.

For example, an effective pulse of the third clock signal ck2 is a low-level signal vgl. The width of an effective pulse of the third clock signal ck2 in the data writing phase t1 is the time period t20 in which the third clock signal ck2 continues as a low-level signal vgl. The width of an effective pulse of the third clock signal ck2 in the second retention frame t22 is the time period t20' in which the third clock signal ck2 continues as a low-level signal vgl. It is to be understood that each time the third clock signal ck2 generates the transition of the effective pulse, the potential of the third node N3 is charged or discharged once, causing waste of power consumption. By setting t20' less than or equal to t20, the discharge duration of the potential of the third node N3 can be reduced when the third clock signal ck2 continues as an effective pulse. Further, the charge duration of the potential of the third node N3 is reduced when the third clock signal ck2 returns to an ineffective fixed level. In this manner, the purpose of saving power consumption can be achieved.

Optionally, with continued reference to FIG. 9, a clock cycle of the third clock signal ck2 in the second retention frame t22 is greater than a clock cycle of the third clock signal ck2 in the data writing phase t1.

For example, a clock cycle of the third clock signal ck2 in the data writing phase t1 is T3. A clock cycle of the third clock signal ck2 in the second retention frame t22 is T3'. On the basis that the width of an effective pulse of the third clock signal ck2 in the second retention frame t22 is less than or equal to the width of an effective pulse of the third clock signal ck2 in the data writing phase t1, T3' is set to be greater than T3. Thus, the transition frequency of the third clock signal ck2 in the retention phase t2 is less than the transition frequency of the third clock signal ck2 in the data writing phase t1. Further, effective pulses of multiple third clock signals ck2 in the second retention frame t22 are remained an ineffective fixed level for a long time period to avoid increasing the power consumption of the shift register circuit 10 caused by charging and discharging the potential of the third node N3 for multiple times, thereby facilitating low power consumption of the shift register circuit 10.

It is to be noted that the time period of the clock cycle T3' of the third clock signal ck2 in the second retention frame t22 may be set according to actual requirements, as long as the time period is longer than the time period of the clock cycle T3 of the third clock signal ck2 in the data writing phase t1. FIG. 9 is shown as an example only. Similarly, when the clock cycle of the first clock signal ck1 in the data writing phase t1 is the same as the clock cycle of the first clock signal ck1 in the retention phase t2, the clock cycle of the third clock signal ck2 in the second retention frame t22 is also greater than the clock cycle of the first clock signal ck1. When the clock cycle of the second clock signal xck in the data writing phase t1 is the same as the clock cycle of the second clock signal xck in the retention phase t2, the clock cycle of the third clock signal ck2 in the second retention frame t22 may also be greater than the clock cycle of the second clock signal xck. On the premise that the bias adjustment of the transistor in the second control module 12 is implemented and the power consumption can be reduced, the length of the clock cycle of the third clock signal ck2 in the second retention frame t22 is not limited in this embodiment of the present disclosure.

Optionally, with continued reference to FIG. 9, the time period of the second retention frame t22 is after the time period of the at least one first retention frame t21.

For example, the time period of the second retention frame t22 is after the time period of the at least one first retention frame t21. This is mainly due to that when the potential of the third node N3 is remained an ineffective fixed level for a long time period, a transistor (for example, the first transistor T1 in FIG. 6) directly electrically connected to the third node N3 is in a bias state for a long time period. This causes the threshold voltage of the transistor to drift to generate a hysteresis effect, thereby affecting the stability of the potential of the second clock signal xck transmitted to the second node N2. Thus, it is necessary to enter to the second retention frame t22 after at least one first retention frame t21 to slow down the hysteresis effect of the transistor directly electrically connected to the third node N3, thereby ensuring the stability of the potential of the second node N2 and saving power consumption.

Figure 10:
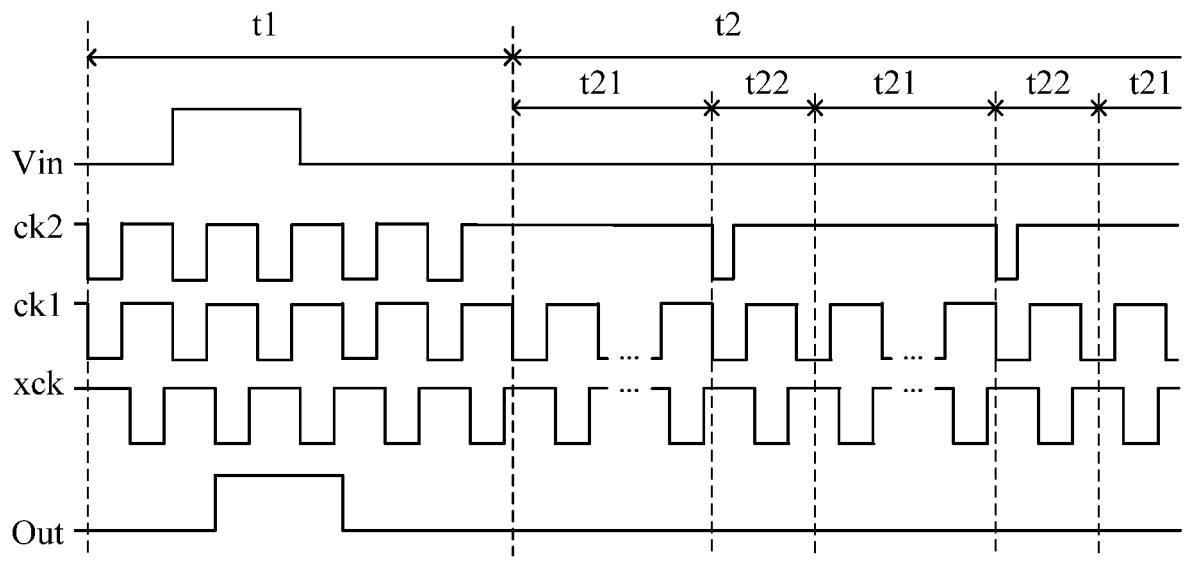
FIG. 10 is a drive timing diagram of another shift register circuit according to an embodiment of the present disclosure.

Optionally, FIG. 10 is a drive timing diagram of another shift register circuit according to an embodiment of the present disclosure. With reference to FIG. 10, the time period of a second retention frame t22 is between the time periods of two adjacent first retention frames t21.

For example, FIG. 10 illustrates that a retention phase t2 includes two second retention frames t22. The time period of a second retention frame t22 is between the time periods of two adjacent first retention frames t21 so that at least one transition occurs between two adjacent long-time ineffective fixed levels of a third clock signal ck2. That is, an ineffective fixed level transitions to an effective pulse to charge and discharge the potential of a third node N3 at least once. Thus, the case in which the potential of the third node N3 is remained a first level signal Vg1 for a long time period affecting the stability of the potential of the second clock signal xck transmitted to the second node N2 is avoided.

It is to be understood that FIG. 10 only illustrates that a retention phase t2 includes two first retention frames t21 and one second retention frame t22. In this embodiment of the present disclosure, the number of first retention frames t21 and the number of second retention frames t22 in the retention phase t2 may be set as desired. This is not specifically limited in this embodiment of the present disclosure.

Figure 11:
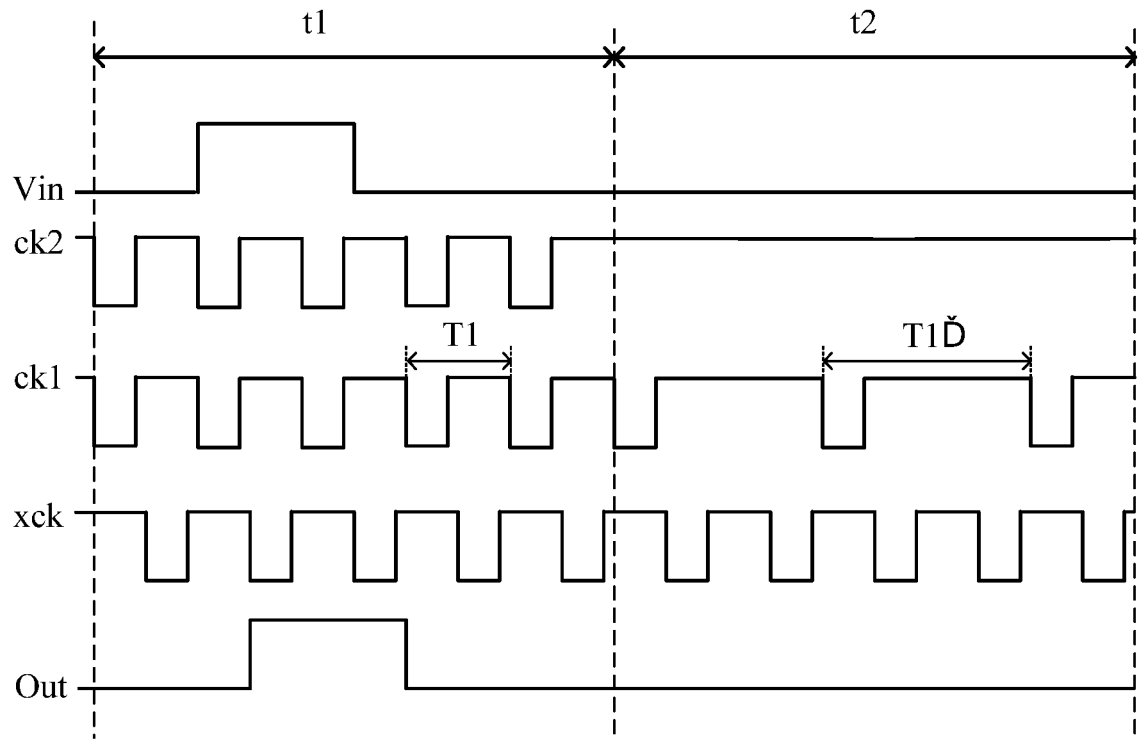
FIG. 11 is a drive timing diagram of another shift register circuit according to an embodiment of the present disclosure.

Optionally, FIG. 11 is a drive timing diagram of another shift register circuit according to an embodiment of the present disclosure. With reference to FIG. 11, in a data writing phase t1, a clock cycle of a first clock signal ck1 is a first clock cycle T1. In at least part of a first retention frame t21, a clock cycle of the first clock signal ck1 is a second clock cycle T1'. The first clock cycle T1 is less than or equal to the second clock cycle T1'.

The second clock cycle T1' may be any value greater than the first clock cycle T1. This is not specifically limited in this embodiment of the present disclosure. FIG. 11 only exemplarily shows that the second clock cycle T1' is twice the first clock cycle T1.

For example, the transition frequency of the first clock signal ck1 in part of the first retention frame t21 is less than the transition frequency of the first clock signal ck1 in the data writing phase t1. Thus, the first clock signal ck1 controls a first control module 11 in the first retention frame t21 at a lower frequency so that the potential of a first node N1 matches an input signal Vin. In this manner, the purpose of saving power consumption can be further achieved.

Exemplarily, with reference to FIG. 7 and FIG. 11, in the data writing phase t1, the first clock signal ck1 can control the first input transistor T6 to be on or off to transmit the input signal Vin of the signal input terminal IN to the first node N1 when the first input transistor T6 is in the on state. When the potential of the first node N1 is an enable level, the signal output terminal OUT outputs the first level signal Vg1 under the control of the potential of the first node N1. In the first retention frame t21, the signal output terminal OUT continuously outputs the first level signal Vg1. That is, the potential of the first node N1 is continuously remained an enable level, while the potential of the second node N2 is continuously remained a disable level. At this time, when the first clock signal ck1 is a disable level, the first control module 11 can still maintain the potential of the first node N1 being an enable level under the control of the second clock signal xck. Therefore, by further reducing the frequency of the effective pulse of the first clock signal ck1, the number of times of turn-on and the number of times of turn-off of the first input transistor T6 under the control of the first clock signal ck1 can be reduced, thereby saving the power consumption.

Figure 12:
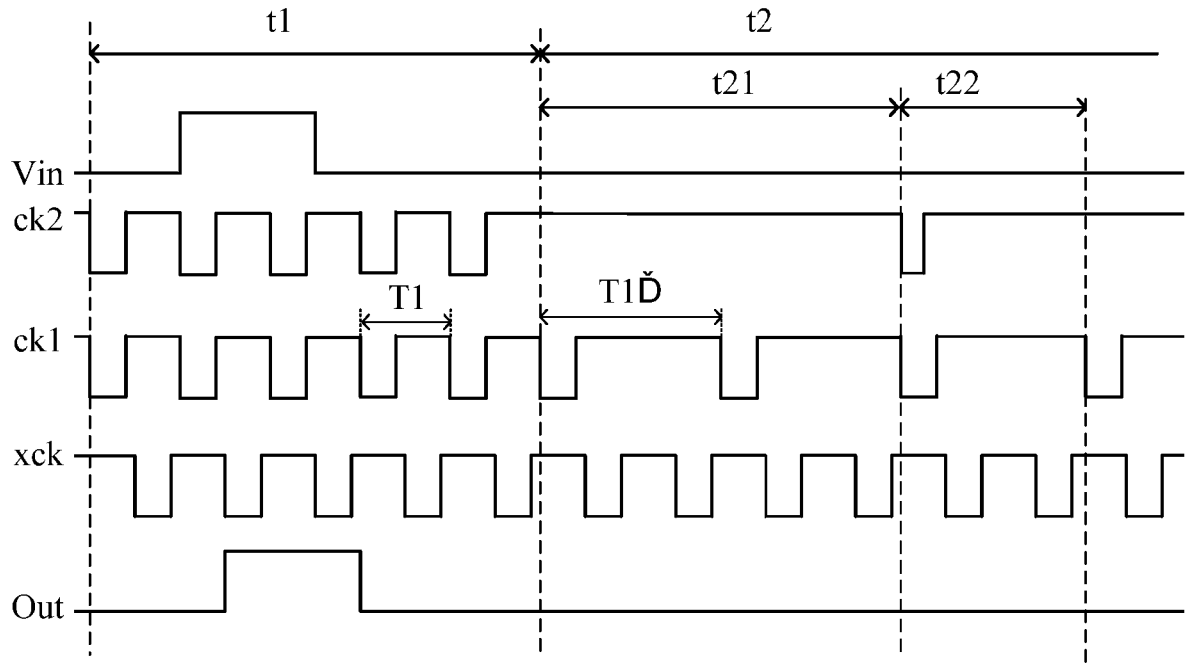
FIG. 12 is a drive timing diagram of another shift register circuit according to an embodiment of the present disclosure.

Optionally, FIG. 12 is a drive timing diagram of another shift register circuit according to an embodiment of the present disclosure. As shown in FIG. 12, a retention phase t2 also includes at least one second retention frame t22. In the second retention frame t22, a third clock signal ck2 includes at least one effective pulse. In the second retention frame t22, the time period of an effective pulse of a first clock signal ck1 overlaps the time period of an effective pulse of the third clock signal ck2.

In the second retention frame t22, the clock cycle of the first clock signal ck1 may be a first clock cycle T1 or a second clock cycle T1'. This is not specifically limited in this embodiment of the present disclosure. FIG. 11 exemplarily shows that the clock cycle of the first clock signal ck1 in the second retention frame t22 is the same as the clock cycle of the first clock signal ck1 in a first retention frame t21, and both are the second clock cycle T1'. However, this is not limited thereto. In addition, FIG. 11 also exemplarily shows that the third clock signal ck2 includes one effective pulse in the second retention frame t22. However, this is not limited thereto.

For example, with reference to FIG. 7 and FIG. 12, in the second retention frame t22, the time period of the effective pulse of the first clock signal ck1 overlaps the time period of the effective pulse of the third clock signal ck2. That is, when the third clock signal ck2 is an effective pulse (that is, an enable level), the first clock signal ck1 is also an effective pulse (that is, an enable level). At this time, the second clock signal xck is a disable level. The first control module 11 transmits the input signal Vin to the first node N1 under the control of the enable level of the first clock signal ck1. The second control module 12 transmits the first level signal Vg1 to the third node N3 under the control of the enable level of the third clock signal ck2. At the same time, the second control module 12 also remains the potential of the second node N2 being the disable level under the control of the disable level of the second clock signal xck.

When the first clock signal ck1 transitions to a disable level, the third clock signal ck2 also transitions to an ineffective fixed level (that is, a disable level). The second clock signal xck transitions to an enable level. Under the control of the enable level of the first clock signal ck1, the first control module 11 blocks the input signal Vin from continuing being transmitted to the first node N1. Moreover, under the control of the second clock signal xck, the first control module 11 makes the potential of the first node N1 continue to be stable at the enable level. Thus, the signal output terminal OUT continues to stably output the first level signal Vg1. At the same time, the second control module 12 transmits the disable level of the third clock signal ck2 to the third node N3 according to the potential of the first node N1. Moreover, under the control of the potential of the third node N3, the second control module 12 makes the potential of the second node N2 continue to stabilize at the disable level.

In this manner, in the second retention frame t22, the time period of the effective pulse of the first clock signal ck1 overlaps the time period of the effective pulse of the third clock signal ck2. Thus, the transistors of the first control module 11 and second control module 12 in the shift register circuit 10 perform a complete driving process once under the control of the first clock signal ck1 and third clock signal, thereby preventing the transistors from generating the hysteresis effect in the same bias state for a long time period, and improving the output accuracy of the shift register circuit.

Figure 13:
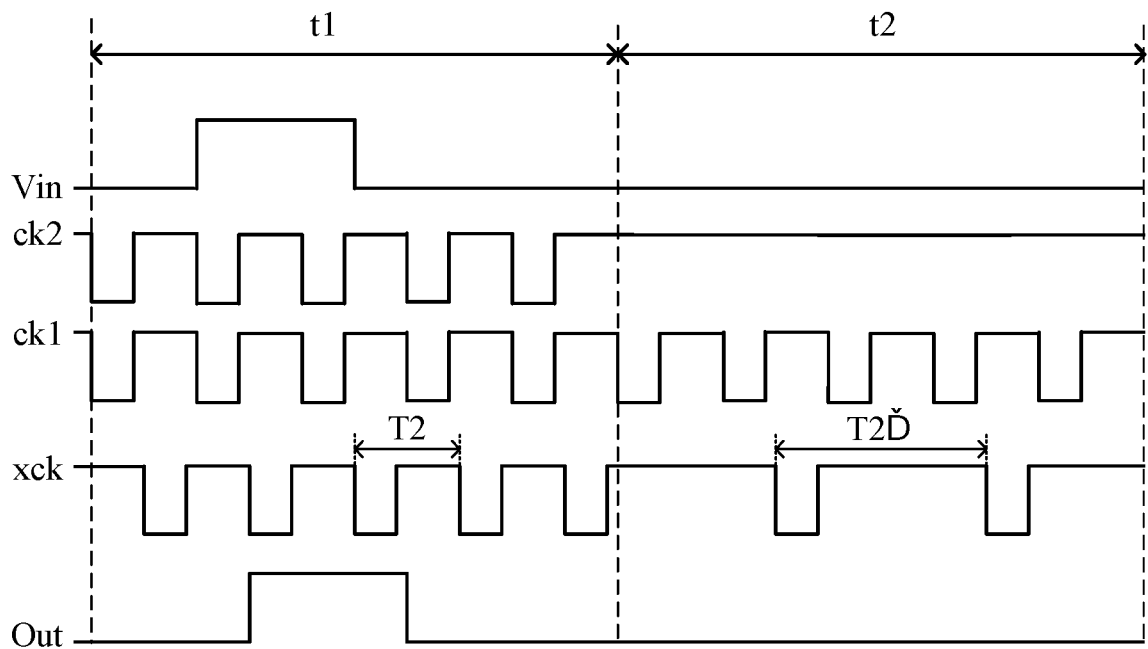
FIG. 13 is a drive timing diagram of another shift register circuit according to an embodiment of the present disclosure.

Optionally, FIG. 13 is a drive timing diagram of another shift register circuit according to an embodiment of the present disclosure. Referring to FIG. 13, in a data writing phase t1, a clock cycle of a second clock signal xck is a third clock cycle T2. In at least part of a retention phase t2, a clock cycle of the second clock signal xck is a fourth clock cycle T2'. The third clock cycle T2 is less than or equal to the fourth clock cycle T2'.

The fourth clock cycle T2' may be any value greater than the third clock cycle T2. This is not specifically limited in this embodiment of the present disclosure. FIG. 12 only exemplarily shows that the fourth clock cycle T2' is twice the third clock cycle T2.

For example, the transition frequency of the second clock signal xck in part of the retention phase t2 is less than the transition frequency of the second clock signal xck in the data writing phase t1. Thus, the second clock signal xck controls a first control module 11 at a lower frequency in the retention phase t2 so that the first control module 11 maintains the stability of the potential of a first node N1 under the control of the second clock signal xck, further achieving the purpose of saving power consumption.

Figure 14:
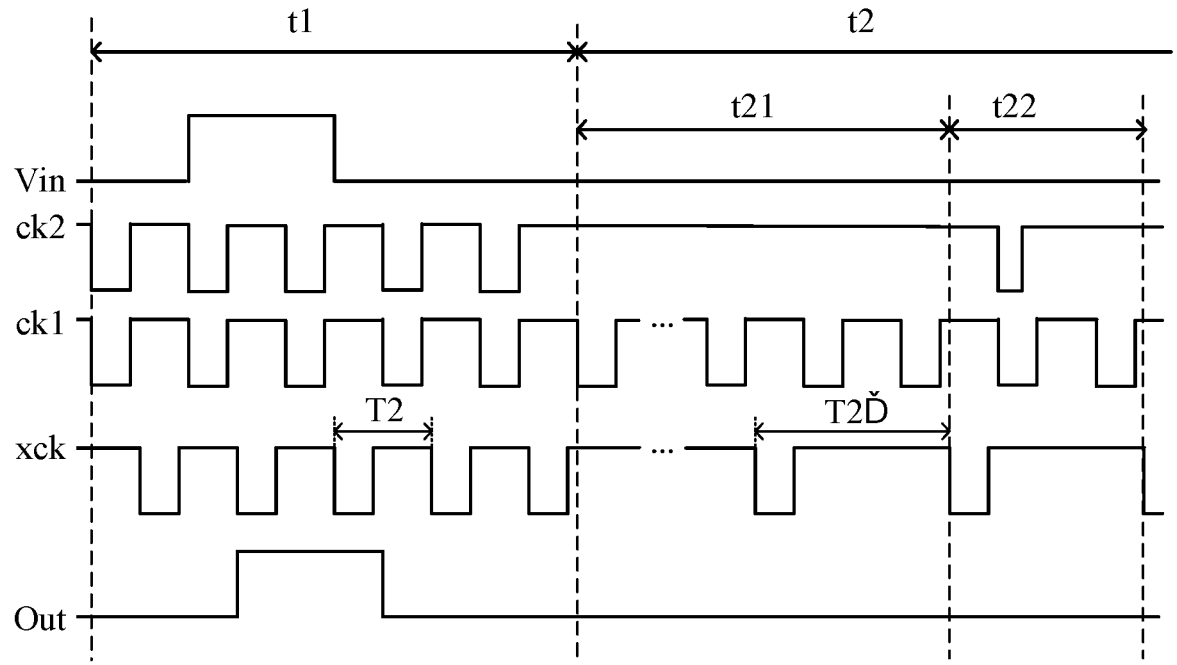
FIG. 14 is a drive timing diagram of another shift register circuit according to an embodiment of the present disclosure.

Optionally, FIG. 14 is a drive timing diagram of another shift register circuit according to an embodiment of the present disclosure. As shown in FIG. 14, when a retention phase t2 also includes at least one second retention frame t22. In the second retention frame t22, a third clock signal ck2 includes at least one effective pulse. In the second retention frame t22, the time period of an effective pulse of a second clock signal xck does not overlap the time period of an effective pulse of the third clock signal ck2.

In the second retention frame t22, a clock cycle of the second clock signal xck may be a third clock cycle T2 or a fourth clock cycle T2'. This is not specifically limited in this embodiment of the present disclosure. FIG. 11 exemplarily shows that the clock cycle of the second clock signal xck in the second retention frame t22 is the fourth clock cycle T2'. However, this is not limited thereto. In addition, FIG. 11 also exemplarily shows that the third clock signal ck2 includes one effective pulse in the second retention frame t22. However, this is not limited thereto.

For example, with reference to FIG. 7 and FIG. 14, in the second retention frame t22, the time period of the effective pulse of the second clock signal xck does not overlap the time period of the effective pulse of the third clock signal ck2. That is, when the third clock signal ck2 is an effective pulse (that is, an enable level), the second clock signal xck is a disable level. At this time, the first control module 11 transmits the first level signal Vg1 to the third node N3 under the control of the third clock signal ck2 to discharge the potential of the third node N3. Thus, a transistor (the first transistor T1 in FIG. 7) electrically connected to the third node N3 is prevented from generating the hysteresis effect due to the potential of the third node N3 being unchanged for a long time period. At the same time, the second control module 12 maintains the potential of the second node N2 to be a disable level under the control of the second clock signal xck.

When the third clock signal ck2 transitions to a disable level, the second clock signal xck is an effective pulse (that is, an enable level). At this time, the first control module 11 can maintain the potential of the first node N1 stable at the enable level under the control of the second clock signal xck. At the same time, the second control module 12 charges the potential of the third node N3 under the control of the third clock signal ck2 so that the potential of the third node N3 is a disable level. The enable level of the second clock signal xck is blocked from being transmitted to the second node N2 so that the potential of the second node N2 is remained a disable level. Thus, the signal output terminal OUT stably outputs the first level signal Vg1.

In this manner, in the second retention frame t22, the time period of the effective pulse of the second clock signal xck does not overlap the time period of the effective pulse of the third clock signal ck2. Thus, the transistors of the first control module 11 and second control module 12 in the shift register circuit 10 perform a complete driving process once under the control of the second clock signal xck and third clock signal, thereby preventing the transistors from generating the hysteresis effect in the same bias state for a long time period, and improving the output accuracy of the shift register circuit.

Figure 15:
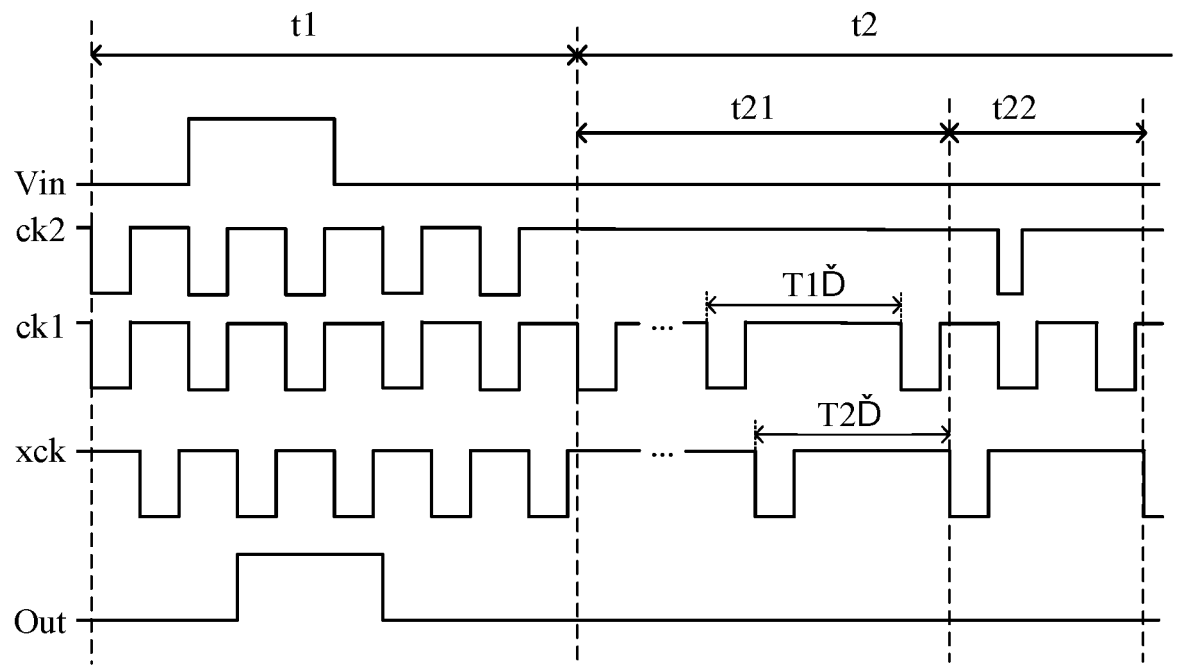
FIG. 15 is a drive timing diagram of another shift register circuit according to an embodiment of the present disclosure.

In an optional embodiment, FIG. 15 is a drive timing diagram of another shift register circuit according to an embodiment of the present disclosure. With reference to FIG. 15, a clock cycle of a first clock signal ck1 in a first retention frame t21 is the same as a clock cycle of a second clock signal xck.

For example, in the first retention frame t21, the clock cycle of the first clock signal ck1 is T1'. The clock cycle of the second clock signal xck is T2'. When the clock cycle T1' of the first clock signal ck1 is the same as the clock cycle T2' of the second clock signal xck in the first retention frame t21, since the clock cycle of the second clock signal xck in the first retention frame t21 is greater than a clock cycle T2 of the second clock signal xck in a data writing phase t1, the clock cycle T1' of the first clock signal ck1 in the first retention frame t21 is greater than a clock cycle T1 of the first clock signal ck1 in the data writing phase t1. In this manner, in the first retention frame t21, the frequency of the first clock signal ck1 and the frequency of the second clock signal xck are reduced to the same extent, thereby saving power consumption when ensuring the normal working of the shift register circuit 10.

Figure 16:
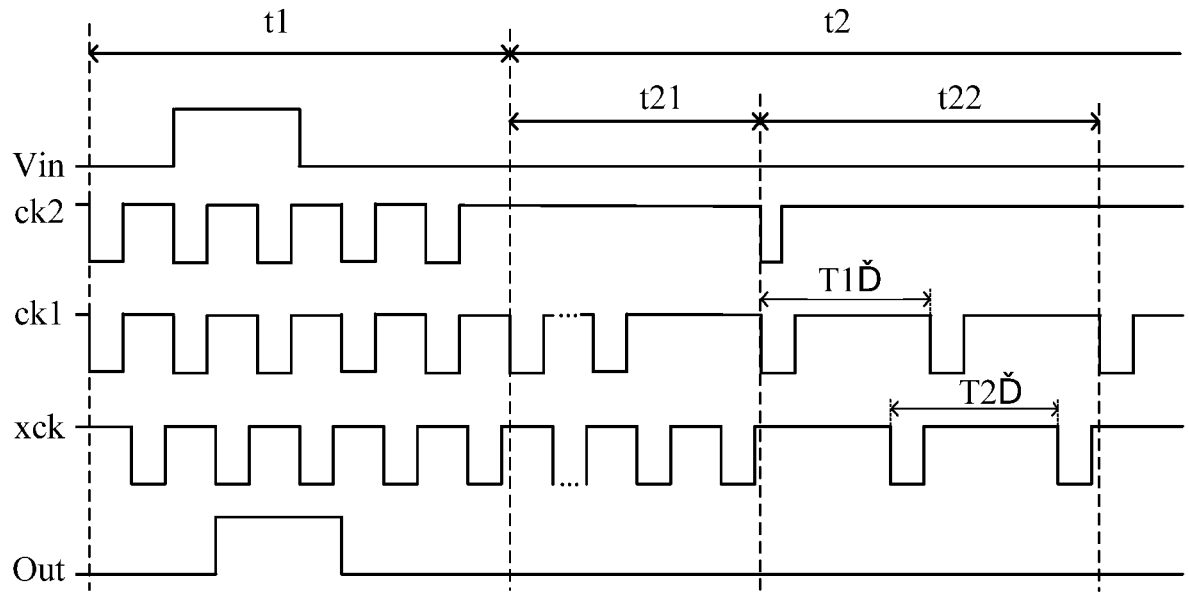
FIG. 16 is a drive timing diagram of another shift register circuit according to an embodiment of the present disclosure.

In another optional embodiment, FIG. 16 is a drive timing diagram of another shift register circuit according to an embodiment of the present disclosure. With reference to FIG. 16, in a second retention frame t22, a clock cycle of a first clock signal ck1 is the same as a clock cycle of a second clock signal xck.

For example, in the second retention frame t22, the clock cycle of the first clock signal ck1 is T1'. The clock cycle of the second clock signal xck is T2'. When the clock cycle T1' of the first clock signal ck1 is the same as the clock cycle T2' of the second clock signal xck in the second retention frame t22, since the clock cycle of the second clock signal xck in the second retention frame t22 is greater than a clock cycle T2 of the second clock signal xck in a data writing phase t1, the clock cycle T1' of the first clock signal ck1 in the second retention frame t22 is greater than a clock cycle T1 of the first clock signal ck1 in the data writing phase t1. In this manner, in the second retention frame t22, the frequency of the first clock signal ck1 and the frequency of the second clock signal xck are reduced to the same extent, thereby saving power consumption when ensuring the normal working of the shift register circuit 10.

Figure 17:
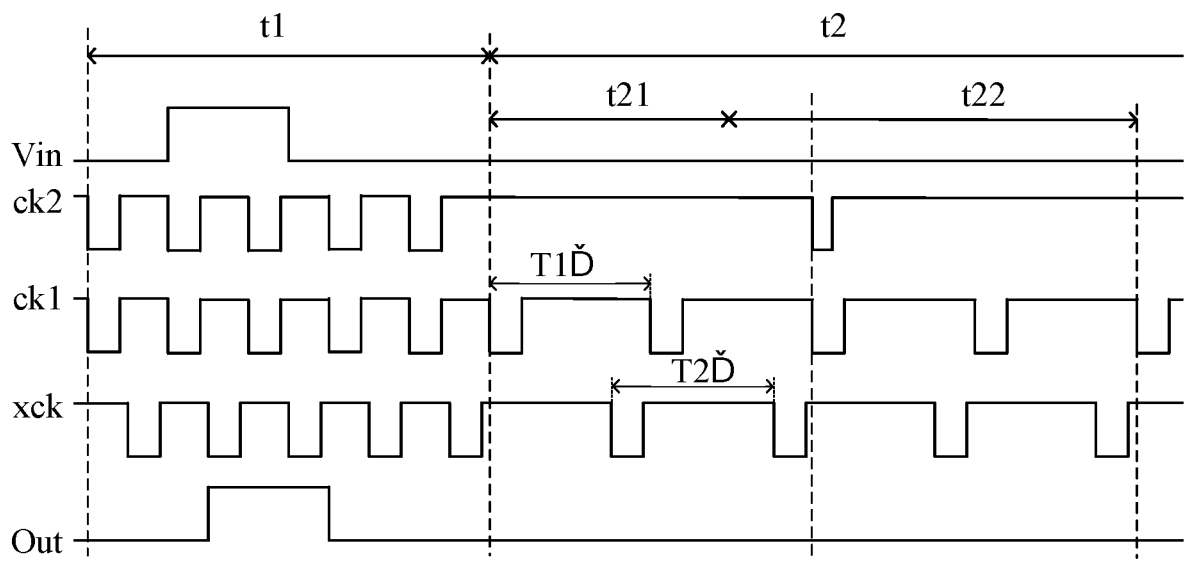
FIG. 17 is a drive timing diagram of another shift register circuit according to an embodiment of the present disclosure.

In another optional embodiment, FIG. 17 is a drive timing diagram of another shift register circuit according to an embodiment of the present disclosure. With reference to FIG. 17, in a first retention frame t21, a clock cycle of a first clock signal ck1 is the same as a clock cycle of a second clock signal xck. In a second retention frame t22, a clock cycle of the first clock signal ck1 is the same as a clock cycle of the second clock signal xck. Further, the frequency of the first clock signal ck1 and the frequency of the second clock signal xck in a retention phase t2 are reduced to the same extent to ensure the normal working of a shift register circuit 10 and save power consumption.

Figure 18:
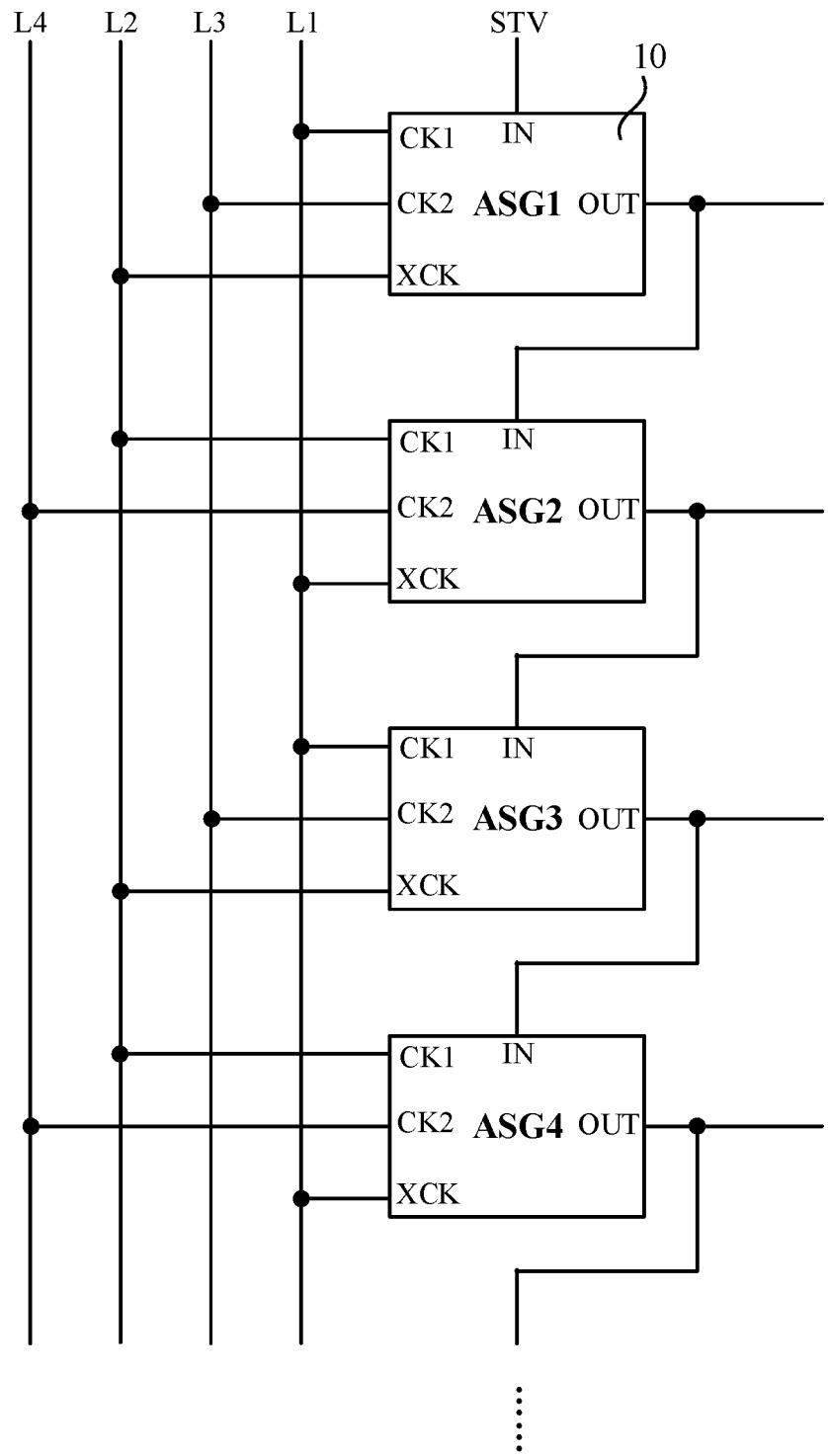
FIG. 18 is a diagram illustrating the structure of another shift register according to an embodiment of the present disclosure.

On the basis of any one of the preceding embodiments, optionally, FIG. 18 is a diagram illustrating the structure of another shift register according to an embodiment of the present disclosure. Referring to FIG. 18, in shift register circuit 10 at each of stages, a signal input terminal IN of a shift register circuit 10 at a (i+1)-th stage is electrically connected to a signal output terminal OUT of a shift register circuit 10 at an i-th stage. A signal input terminal IN of a shift register circuit 10 at a first stage receives a start pulse signal Sty. i is a positive integer. A first clock signal ck1 received by the shift register circuit 10 at the i-th stage also serves as a second clock signal xck received by the shift register circuit at the (i+1)-th stage. Moreover/alternatively, the second clock signal xck received by the shift register circuit 10 at the i-th stage also serves as the first clock signal ck1 received by the shift register circuit 10 at the (i+1)-th stage.

It is to be understood that a shift register circuit 10 at each stage includes a first clock terminal CK1, a second clock terminal XCK, and a third clock terminal CK2. That is, the shift register circuit 10 at each stage requires three clock signals such that an entire shift register 100 requires multiple clock signals. This increases the number of signal terminals in a driver chip for supplying clock signals to shift register circuit 10 at each of stages in the shift register 100 and is not conducive to the low cost of the driver chip. At the same time, to ensure that each clock signal does not affect each other in the transmission process, it is necessary to set clock signal transmission lines having corresponding spacings and widths for transmitting different clock signals in a one-to-one manner. This increases the bezel size of a display panel and is not conducive to the narrow bezel of the display panel.

Exemplarily, FIG. 18 shows a structure diagram of the shift register circuit 10 at the first stage to a shift register circuit 10 at a fourth stage (that is, ASG1, ASG2, ASG3, and ASG4). The input terminal of the shift register circuit 10 at the first stage is electrically connected to a start pulse signal line STV transmitting the start pulse signal Sty. From a shift register circuit 10 at a second stage to the shift register circuit 10 at the fourth stage, a signal input terminal IN of a shift register circuit 10 at each stage is electrically connected to a signal output terminal OUT of a shift register circuit 10 at a previous stage. In the shift register circuit 10 at the first stage, the first clock terminal CK1 is electrically connected to the first clock signal line L1 transmitting the first clock signal ck1. The second clock terminal XCK is electrically connected to the second clock signal line L2 transmitting the second clock signal xck. The third clock terminal CK2 is electrically connected to the third clock signal line L3 transmitting the third clock signal ck2.

The time period of the effective pulse of the first clock signal ck1 does not overlap the time period of the effective pulse of the second clock signal xck. Thus, in shift register circuits 10 at two adjacent stages, the first clock signal ck1 of a shift register circuit 10 at the previous stage can also serve as the second clock signal xck of a shift register circuit 10 at the subsequent stage to reduce the number of clock signals supplied to the shift register circuits 10 at each of the stages in the shift register 100. Alternatively, the second clock signal xck of a shift register circuit 10 at the previous stage also serves as the first clock signal ck1 of a shift register circuit 10 at the subsequent stage. This is also conducive to reducing the number of clock signals supplied to the shift register circuits 10 at each of the stages in the shift register 100. FIG. 18 exemplarily shows the structure diagram that the first clock signal ck1 received by the shift register circuit 10 at the i-th stage also serves as the second clock signal xck received by the shift register circuit at the (i+1)-th stage, and the second clock signal xck received by the shift register circuit 10 at the i-th stage also serves as the first clock signal ck1 received by the shift register circuit 10 at the (i+1)-th stage. However, this is not limited thereto. For example, i=1. The first clock terminal CK1 of the shift register circuit 10 at the first stage and the second clock terminal XCK of the shift register circuit 10 at the second stage are both electrically connected to the first clock signal line L1. The second clock terminal XCK of the shift register circuit 10 at the first stage and the first clock terminal CK1 of the shift register circuit 10 at the second stage are both electrically connected to the second clock signal line L2. Thus, this is conducive to reducing the number of signal terminals in a driver chip for supplying clock signals to shift register circuit 10 at each of stages in the shift register 100 and conducive to the low cost of the driver chip. At the same time, when the number of clock signals supplied to shift register circuit 10 at each of stages in the shift register 100 is reduced, it is conducive to reducing the number of signal lines used for transmitting the clock signals, thereby facilitating the narrow bezel of the display panel.

Optionally, with continued reference to FIG. 18, the third clock signal ck2 received by the shift register circuit 10 at the i-th stage also serves as a third clock signal ck2 received by a shift register circuit 10 at a (i+2)-th stage. Moreover/alternatively, the first clock signal ck1 received by the shift register circuit 10 at the i-th stage also serves as a first clock signal ck1 received by a shift register circuit 10 at a (i+2)-th stage.

For example, the third clock signal ck2 received by the shift register circuit 10 at the i-th stage also serves as a third clock signal ck2 received by the shift register circuit 10 at the (i+2)-th stage. At this time, the third clock signal ck2 received by the shift register circuit 10 at the i-th stage and the third clock signal ck2 received by the shift register circuit 10 at the (i+1)-th stage may come from different clock signal lines or may come from the same clock signal line. This is not specifically limited in this embodiment of the present disclosure. Exemplarily, with reference to FIG. 17, the third clock signal ck2 received by the shift register circuit 10 at the first stage also serves as a third clock signal ck2 received by a shift register circuit 10 at a third stage. That is, the third clock terminal CK2 of the shift register circuit 10 at the first stage and the third clock terminal CK2 of the shift register circuit 10 at the third stage are both electrically connected to a third clock signal line L3. Accordingly, the third clock signal ck2 received by the shift register circuit 10 at the second stage also serves as a third clock signal ck2 received by a shift register circuit 10 at a fourth stage. That is, the third clock terminal CK2 of the shift register circuit 10 at the second stage and the third clock terminal CK2 of the shift register circuit 10 at the fourth stage are both electrically connected to a fourth clock signal line L4.

Similarly, the first clock signal ck1 received by the shift register circuit 10 at the i-th stage also serves as the first clock signal ck1 received by the shift register circuit 10 at the (i+2)-th stage. That is, the first clock terminal CK1 of the shift register circuit 10 at the i-th stage and a first clock terminal CK1 of the shift register circuit 10 at the (i+2)-th stage are electrically connected to the same clock signal line. Thus, the number of clock signal lines for transmitting first clock signals ck1 to the shift register circuits is reduced. Exemplarily, FIG. 17 also shows that the first clock terminal CK1 of the shift register circuit 10 at the first stage and the first clock terminal CK1 of the shift register circuit 10 at the third stage are both electrically connected to a first clock signal line L1, and the first clock terminal CK1 of the shift register circuit 10 at the second stage and the first clock terminal CK1 of the shift register circuit 10 at the fourth stage are both electrically connected to a second clock signal line L2. In this manner, the number of signal lines used for transmitting the clock signals is reduced, and the narrow bezel of the display panel is facilitated.

Optionally, with continued reference to FIG. 18, the time period of the effective pulse of the third clock signal ck2 received by the shift register circuit 10 at the i-th stage does not overlap the time period of the effective pulse of the third clock signal ck2 received by the shift register circuit 10 at the (i+1)-th stage.

For example, the time period of the effective pulse of the third clock signal ck2 received by the shift register circuit 10 at the i-th stage does not overlap the time period of the effective pulse of the third clock signal ck2 received by the shift register circuit 10 at the (i+1)-th stage to ensure that shift register circuits 10 at two adjacent stages can work normally. In this case, the third clock terminal CK2 of the shift register circuit 10 at the i-th stage and the third clock terminal CK2 of the shift register circuit 10 at the (i+1)-th stage may be electrically connected to different signal lines. With continued reference to FIG. 17, for example, i=1. The third clock terminal CK2 of the shift register circuit 10 at the first stage is electrically connected to the third clock signal line L3. The third clock terminal CK2 of the shift register circuit 10 at the second stage is electrically connected to the fourth clock signal line L4. However, this is not limited thereto.

Optionally, with continued reference to FIG. 18, the second clock signal xck received by the shift register circuit 10 at the i-th stage also serves as a second clock signal xck received by the shift register circuit 10 at the (i+2)-th stage.

For example, the second clock signal xck received by the shift register circuit 10 at the i-th stage also serves as the second clock signal xck received by the shift register circuit 10 at the (i+2)-th stage. That is, the second clock terminal XCK of the shift register circuit 10 at the i-th stage and the second clock terminal XCK of the shift register circuit 10 at the (i+2)-th stage may be electrically connected to the same clock signal line. FIG. 18 exemplarily shows that the second clock terminal XCK of the shift register circuit 10 at the first stage and the second clock terminal XCK of the shift register circuit 10 at the third stage are both electrically connected to the second clock signal line L2, and the second clock terminal XCK of the shift register circuit 10 at the second stage and the second clock terminal XCK of the shift register circuit 10 at the fourth stage are both electrically connected to the first clock signal line L1. In this manner, the number of signal terminals in a driver chip for supplying clock signals to shift register circuit 10 at each of stages in the shift register 100 is reduced, the structure is simplified, and the cost is reduced. The number of signal lines for transmitting the clock signals is also reduced, thereby facilitating the narrow bezel of the display panel.

Based on the same inventive concept, an embodiment of the present disclosure also provides a display panel. The display panel includes the shift register in any one of the preceding embodiments. Therefore, the display panel provided in this embodiment of the present disclosure includes the technical features of the shift register circuit provided in the embodiments of the present disclosure and can achieve the beneficial effects of the shift register circuit provided in the embodiments of the present disclosure. Similarities may be referred to the preceding description of the shift register circuit provided in the embodiments of the present disclosure and are not described here.

Figure 19:
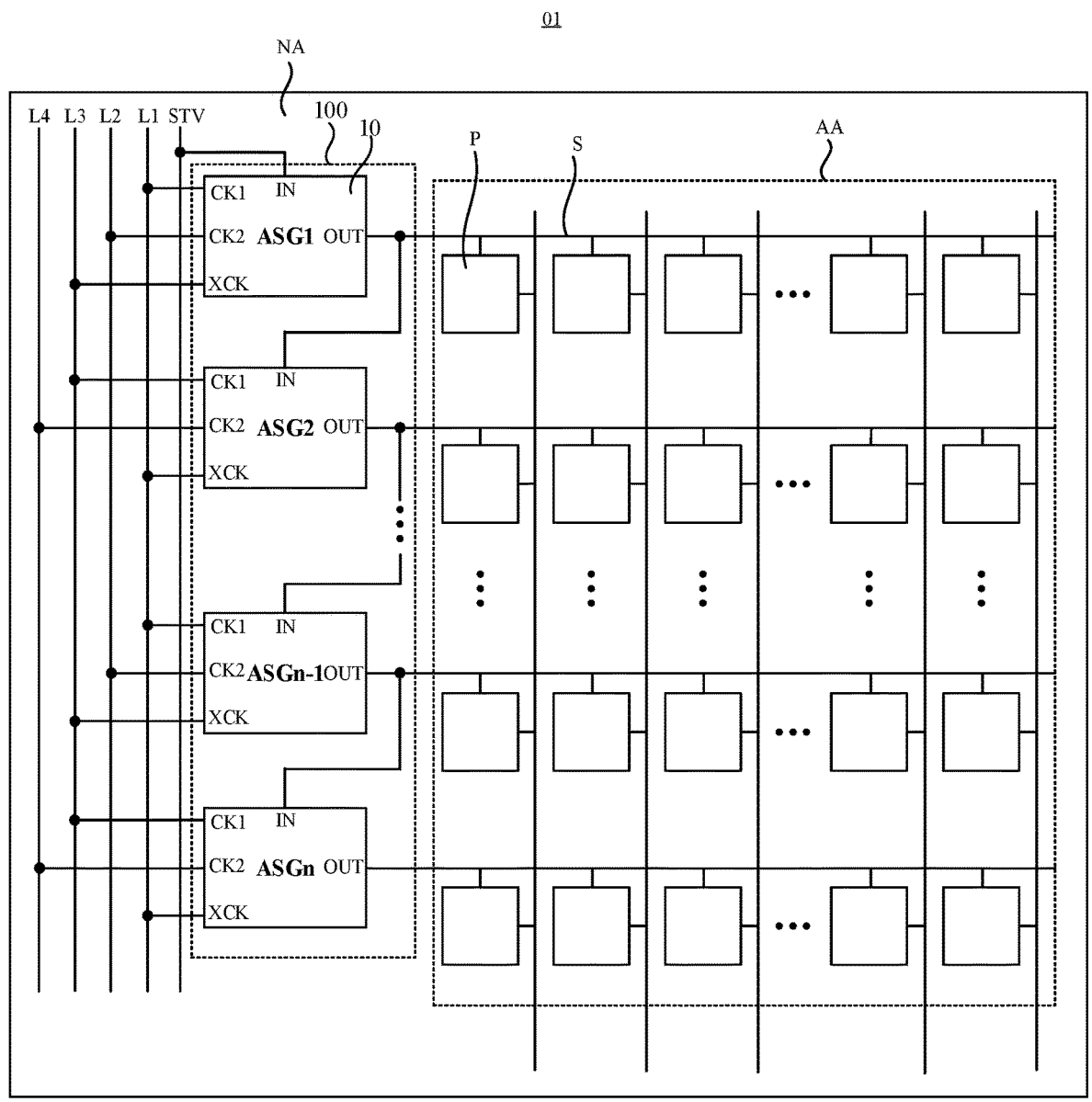
FIG. 19 is a diagram illustrating the structure of a display panel according to an embodiment of the present disclosure.

Optionally, FIG. 19 is a diagram illustrating the structure of a display panel according to an embodiment of the present disclosure. As shown in FIG. 19, a display panel 01 includes a display region AA and a non-display region NA. The display region AA is provided with pixel circuits P arranged in an array and scan signal lines S. The non-display region NA is provided with a shift register 100. At least part of the pixel circuits P located in the same row are electrically connected to the same scan signal line S. Signal output terminals OUT of shift register circuits 10 at different stages (that is, ASG1 to ASGn) in the shift register 100 are electrically connected to at least one scan signal line S. Each scan signal line S is electrically connected to one shift register circuit 10. Thus, a shift register circuit 10 at each stage can supply a corresponding scan signal to each scan signal line S so that transistors in the pixel circuits P are turned on or off under the control of the scan signal, implementing the row-by-row scanning of pixel circuits P in the display panel 01.

Figure 20:
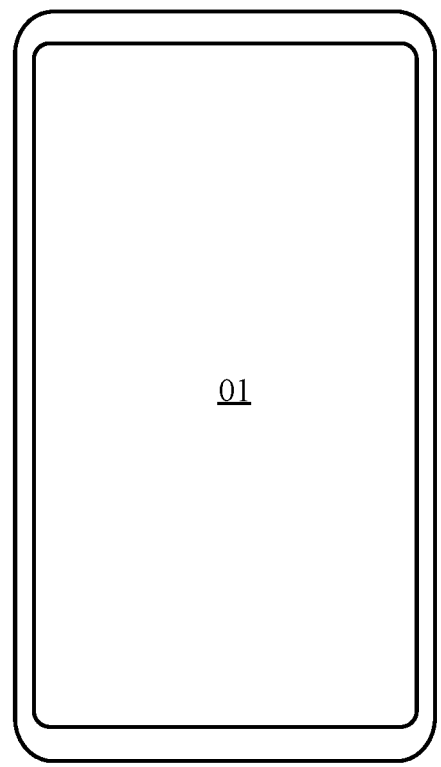
FIG. 20 is a diagram illustrating the structure of a display apparatus according to an embodiment of the present disclosure.

Based on the same inventive concept, an embodiment of the present disclosure also provides a display apparatus. FIG. 20 is a diagram illustrating the structure of a display apparatus according to an embodiment of the present disclosure. As shown in FIG. 20, a display apparatus 02 includes the display panel 01 provided in any embodiment of the present disclosure. The display apparatus 02 provided in this embodiment of the present disclosure may be a mobile phone or may be any electronic product with a display function, including but not limited to a television, a laptop, a desktop display, a tablet computer, a digital camera, a smart bracelet, a smart glass, a vehicle-mounted display, medical equipment, industrial control equipment, and a touch interactive terminal. This is not specifically limited in this embodiment of the present disclosure.

It is to be noted that the preceding are only preferred embodiments of the present disclosure and the technical principles used therein. It is to be understood by those skilled in the art that the present disclosure is not limited to the embodiments herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A shift register, comprising a plurality of shift register circuits which are cascaded, wherein each shift register circuit of the plurality of shift register circuits comprises a first clock terminal, a second clock terminal, a third clock terminal, a first level terminal, a second level terminal, a signal input terminal, a signal output terminal, a first control module, a second control module, and an output module; wherein in a same shift register circuit of the plurality of shift register circuits, the first control module and the output module are electrically connected to a first node; the first control module is further electrically connected to the first clock terminal, the second clock terminal, and the signal input terminal; the first control module is configured to control potential of the first node according to a first clock signal of the first clock terminal, a second clock signal of the second clock terminal, and an input signal of the signal input terminal;

the second control module and the output module are electrically connected to a second node; the second control module is further electrically connected to the third clock terminal, the first level terminal, and the first node; the second control module is configured to control potential of the second node according to a third clock signal of the third clock terminal, a first level signal of the first level terminal, and the potential of the first node; and the output module is further electrically connected to the first level terminal, the second level terminal, and the signal output terminal, separately; and the output module is configured to control, under control of the potential of the first node, a time point at which the signal output terminal outputs the first level signal and control, under control of the potential of the second node, a time point at which the signal output terminal outputs a second level signal of the second level terminal; and wherein each drive cycle of the shift register comprises a data writing phase and a retention phase, wherein the retention phase comprises at least one first retention frame; in the data writing phase, the third clock signal comprises a plurality of effective pulses; and at least in the at least one first retention frame, the third clock signal is an ineffective fixed level.

2. The shift register according to claim 1, wherein the second control module comprises a second node control unit and a third node control unit, wherein in the same shift register circuit of the plurality of shift register circuits, the third node control unit and the second node control unit are electrically connected to a third node; the third node control unit is further electrically connected to the first node, the third clock terminal, and the first level terminal, separately; the third node control unit is configured to control, under the control of the potential of the first node, a time point at which the third clock signal is transmitted to the third node and control, under control of the third clock signal, a time point at which the first level signal is transmitted to the third node; and the second node control unit is further electrically connected to the second clock terminal and the second node, separately, and the second node control unit is configured to control the potential of the second node according to the second clock signal and potential of the third node.

3. The shift register according to claim 2, wherein the second node control unit comprises a first capacitor, a first transistor, and a second transistor, wherein in the same shift register circuit of the plurality of shift register circuits, a first plate of the first capacitor and a gate of the first transistor are both coupled to the third node; a first terminal of the first transistor is electrically connected to the second clock terminal; and a second terminal of the first transistor is electrically connected to a second plate of the first capacitor; and a gate of the second transistor is electrically connected to the second clock terminal, a first terminal of the second transistor is electrically connected to the second plate of the first capacitor, and a second terminal of the second transistor is electrically connected to the second node.

4. The shift register according to claim 1, wherein at least one of following is satisfied:
a clock cycle of the first clock signal in the retention phase is same as a clock cycle of the first clock signal in the data writing phase; and a width of an effective pulse of the first clock signal in the retention phase is same as a width of an effective pulse of the first clock signal in the data writing phase; or
a clock cycle of the second clock signal in the retention phase is the same as a clock cycle of the second clock signal in the data writing phase; and a width of an effective pulse of the second clock signal in the retention phase is same as a width of an effective pulse of the second clock signal in the data writing phase.

5. The shift register according to claim 1, wherein the retention phase further comprises at least one second retention frame; and in the at least one second retention frame, the third clock signal comprises at least one effective pulse of the plurality of effective pulses.

6. The shift register according to claim 5, wherein a width of the at least one effective pulse of the third clock signal in the at least one second retention frame is less than or equal to a width of one effective pulse of the third clock signal in the data writing phase.

7. The shift register according to claim 6, wherein a clock cycle of the third clock signal in the at least one second retention frame is greater than a clock cycle of the third clock signal in the data writing phase.

8. The shift register according to claim 5, wherein a time period of the at least one second retention frame is after a time period of the at least one first retention frame.

9. The shift register according to claim 5, wherein a time period of the at least one second retention frame is between time periods of two adjacent first retention frames.

10. The shift register according to claim 1, wherein for the third clock signal, a time period to maintain the ineffective fixed level in the at least one first retention frame is longer than a time interval between two adjacent effective pulses of the plurality of effective pulses in the data writing phase.

11. The shift register according to claim 1, wherein in the data writing phase, a clock cycle of the first clock signal is a first clock cycle; and in at least part of the at least one first retention frame, a clock cycle of the first clock signal is a second clock cycle, wherein the first clock cycle is less than or equal to the second clock cycle.

12. The shift register according to claim 11, wherein the retention phase further comprises at least one second retention frame, wherein in the at least one second retention frame, the third clock signal comprises at least one effective pulse of the plurality of effective pulses; and
in the at least one second retention frame, a time period of an effective pulse of the first clock signal overlaps a time period of an effective pulse of the third clock signal.

13. The shift register according to claim 1, wherein in the data writing phase, a clock cycle of the second clock signal is a third clock cycle; and in at least part of the retention phase, a clock cycle of the second clock signal is a fourth clock cycle, wherein the third clock cycle is less than or equal to the fourth clock cycle.

14. The shift register according to claim 13, wherein the retention phase further comprises at least one second retention frame, wherein in the at least one second retention frame, the third clock signal comprises at least one effective pulse of the plurality of effective pulses; and
in the at least one second retention frame, a time period of an effective pulse of the second clock signal does not overlap a time period of an effective pulse of the third clock signal.

15. The shift register according to claim 14, wherein at least one of following is satisfied:
in the at least one first retention frame, a clock cycle of the first clock signal is same as a clock cycle of the second clock signal; or
in the at least one second retention frame, a clock cycle of the first clock signal is same as a clock cycle of the second clock signal.

16. The shift register according to claim 1, wherein in the plurality of shift register circuits, a signal input terminal of a shift register circuit at a (i+1)-th stage is electrically connected to a signal output terminal of a shift register circuit at an i-th stage; and a signal input terminal of a shift register circuit at a first stage receives a start pulse signal, wherein i is a positive integer; and
at least one of following is satisfied: a first clock signal received by the shift register circuit at the i-th stage also serves as a second clock signal received by the shift register circuit at the (i+1)-th stage; or, a second clock signal received by the shift register circuit at the i-th stage also serves as a first clock signal received by the shift register circuit at the (i+1)-th stage.

17. The shift register according to claim 16, wherein at least one of following is satisfied:
a third clock signal received by the shift register circuit at the i-th stage also serves as a third clock signal received by a shift register circuit at a (i+2)-th stage; or
the first clock signal received by the shift register circuit at the i-th stage also serves as a first clock signal received by the shift register circuit at the (i+2)-th stage.

18. The shift register according to claim 16, wherein a time period of an effective pulse of the third clock signal received by the shift register circuit at the i-th stage does not overlap a time period of an effective pulse of the third clock signal received by the shift register circuit at the (i+1)-th stage.

19. The shift register according to claim 16, wherein the second clock signal received by the shift register circuit at the i-th stage also serves as a second clock signal received by a shift register circuit at a (i+2)-th stage.

20. A display panel, comprising a shift register, wherein the shift register comprises a plurality of shift register circuits which are cascaded, and each shift register circuit of the plurality of shift register circuits comprises a first clock terminal, a second clock terminal, a third clock terminal, a first level terminal, a second level terminal, a signal input terminal, a signal output terminal, a first control module, a second control module, and an output module; wherein
in a same shift register circuit of the plurality of shift register circuits,
the first control module and the output module are electrically connected to a first node; the first control module is further electrically connected to the first clock terminal, the second clock terminal, and the signal input terminal; the first control module is configured to control potential of the first node according to a first clock signal of the first clock terminal, a second clock signal of the second clock terminal, and an input signal of the signal input terminal;

the second control module and the output module are electrically connected to a second node; the second control module is further electrically connected to the third clock terminal, the first level terminal, and the first node; the second control module is configured to control potential of the second node according to a third clock signal of the third clock terminal, a first level signal of the first level terminal, and the potential of the first node; and the output module is further electrically connected to the first level terminal, the second level terminal, and the signal output terminal, separately; and the output module is configured to control, under control of the potential of the first node, a time point at which the signal output terminal outputs the first level signal and control, under control of the potential of the second node, a time point at which the signal output terminal outputs a second level signal of the second level terminal; and wherein each drive cycle of the shift register comprises a data writing phase and a retention phase, wherein the retention phase comprises at least one first retention frame; in the data writing phase, the third clock signal comprises a plurality of effective pulses; and at least in the at least one first retention frame, the third clock signal is an ineffective fixed level.

* * * * *